United States Patent
Sato et al.

(10) Patent No.: US 8,490,571 B2
(45) Date of Patent: Jul. 23, 2013

(54) COATER, METHOD FOR MANUFACTURING COATED ARTICLE, AND FLUID BLOWING UNIT

(75) Inventors: Tsuyoshi Sato, Yokohama (JP); Hiroyasu Kondo, Yokohama (JP); Naoaki Sakurai, Yokohama (JP); Junsei Yamabe, Yokohama (JP); Katsuyuki Soeda, Yokohama (JP); Hiroshi Koizumi, Hiratsuka (JP); Shuichi Kimura, Yokohama (JP); Shizuo Kinoshita, Yokohama (JP)

(73) Assignees: Kabushiki Kaisha Toshiba, Tokyo (JP); Canon Kabushiki Kaisha, Tokyo (JP)

( * ) Notice: Subject to any disclaimer, the term of this patent is extended or adjusted under 35 U.S.C. 154(b) by 798 days.

(21) Appl. No.: 12/528,866

(22) PCT Filed: Feb. 27, 2008

(86) PCT No.: PCT/JP2008/053428
§ 371 (c)(1),
(2), (4) Date: Dec. 1, 2009

(87) PCT Pub. No.: WO2008/105467
PCT Pub. Date: Sep. 4, 2008

(65) Prior Publication Data
US 2010/0112225 A1    May 6, 2010

(30) Foreign Application Priority Data

Feb. 27, 2007  (JP) .................................. 2007-047668
Feb. 27, 2007  (JP) .................................. 2007-047680
Jul. 18, 2007  (JP) .................................. 2007-187109

(51) Int. Cl.
*B05D 3/00*    (2006.01)
*B05C 11/00*   (2006.01)

(52) U.S. Cl.
USPC .............................................. 118/58; 427/335

(58) Field of Classification Search
None
See application file for complete search history.

(56) References Cited

U.S. PATENT DOCUMENTS

| | | | |
|---|---|---|---|
| 5,136,973 A | * | 8/1992 | Nies et al. ................ 118/633 |
| 6,808,566 B2 | | 10/2004 | Kitano et al. |
| 7,534,467 B2 | | 5/2009 | Kitano et al. |
| 2002/0037367 A1 | | 3/2002 | Ema et al. |

FOREIGN PATENT DOCUMENTS

| | | |
|---|---|---|
| JP | 36-009437 B1 | 7/1961 |
| JP | 47-34127 A | 11/1972 |
| JP | 57-153757 A | 9/1982 |

(Continued)

OTHER PUBLICATIONS

Munemitsu et al, JP 2005-334810, English translation.*

(Continued)

*Primary Examiner* — Dah-Wei Yuan
*Assistant Examiner* — Charles Capozzi
(74) *Attorney, Agent, or Firm* — Pearne & Gordon LLP

(57) ABSTRACT

A coater (1) includes: a droplet jet part (4) which ejects droplets of a first solution toward an object to be coated (2) to apply the droplets to the object to be coated (2); and a remoisturizing-drying part (6) which gives a residue of the first solution applied on the object to be coated (2) a solvent capable of dissolving the residue to form an applied body with a second solution containing the residue as a solute, and which dries the formed applied body with the second solution.

20 Claims, 21 Drawing Sheets

FOREIGN PATENT DOCUMENTS

| | | |
|---|---|---|
| JP | 01-236967 A | 9/1989 |
| JP | 03-030861 A | 2/1991 |
| JP | 11-026443 A | 1/1999 |
| JP | 2000-150357 A | 5/2000 |
| JP | 2001-235277 A | 8/2001 |
| JP | 2001-291583 A | 10/2001 |
| JP | 2002-110512 A | 4/2002 |
| JP | 2003-142261 A | 5/2003 |
| JP | 2003-190861 A | 7/2003 |
| JP | 2003-234273 A | 8/2003 |
| JP | 2004-188321 A | 7/2004 |
| JP | 2004-209450 A | 7/2004 |
| JP | 2004209450 * | 7/2004 |
| JP | 2004-337679 A | 12/2004 |
| JP | 2005-217370 A | 8/2005 |
| JP | 2005-246274 A | 9/2005 |
| JP | 2005-261398 A | 9/2005 |
| JP | 2005-334810 A | 12/2005 |
| KR | 2003-0025199 A | 3/2003 |

OTHER PUBLICATIONS

Tatsuhiko, JP 2002-110512, English translation.*
Yukinbou, JP 2000-150357, English translation.*
Masaya et al, JP 2004-188321, English translation.*
Korean Office action for 10-2009-7017773 dated Nov. 28, 2011.
Korean Office action for 10-2009-7017773 dated Mar. 16, 2011.
Japanese Office action for 2009-501279 dated May 8, 2012.
Korean Office action for 10-2012-7002294 dated Apr. 19, 2013.

* cited by examiner

COATER, METHOD FOR MANUFACTURING COATED ARTICLE, AND FLUID BLOWING UNIT

TECHNICAL FIELD

The present invention relates to a coater, a method for manufacturing a coated article, and a fluid blowing unit, and particularly relates to an apparatus that ejects droplets toward an object to be coated, a method for manufacturing a coated article to which a solute of the droplets adheres, and a unit that blows a fluid.

BACKGROUND ART

Coaters have been used not only in printing image information, but also in a film formation process when various flat panel displays are manufactured such as liquid crystal displays, organic EL (Electro Luminescence) displays, electron emitter displays, plasma displays, and electrophoretic displays.

Such a coater includes: a droplet jet head (for example, ink jet head) which ejects a solution such as an ink in the form of droplets toward an object to be coated; a dryer which dries the droplets landed on the object to be coated; etc. This coater contributes to manufacturing of various products (coated articles) by landing a plurality of droplets on the object to be coated by the droplet jet head, forming dot strings of a predetermined pattern, drying every droplet on the object to be coated, and forming a coating film according to liquid quality.

In such a coating film formation process, a coater that dries every droplet at a high speed by reduced pressure drying in drying the droplets has been proposed (see, for example, JP-A 2001-235277 and JP-A 2003-234273). Besides a coater body part, this coater includes: an accommodating chamber such as a vacuum chamber which accommodates an object to be coated after coating; an exhaust part which exhausts gas within the accommodating chamber and reduces the pressure within the accommodating chamber; etc.

DISCLOSURE OF THE INVENTION

However, when the droplets are dried by drying such as air drying and reduced pressure drying, nonuniform distribution occurs in a solvent concentration of the atmosphere adjacent to the coated surface of a substrate due to an influence of air current or the like generated within the accommodating chamber. As a result, the droplets behave variously when each droplet is dried within the coated surface. For this reason, when the entire coated surface is observed spot by spot, the thickness distribution (sectional shape in a thickness direction) of the coating film, which is formed of dissolved matters remaining on the object to be coated after the drying of every droplet, is not even. In other words, the sectional shape in the thickness direction of each dissolved matter in one region is different from those in the other regions within the coated surface in the end. This causes the quality of a product unstable.

The present invention has been made in order to solve the above-mentioned problem. An object of the present invention is to provide a coater, a method for manufacturing a coated article, and a fluid blowing unit, which are capable of uniform coating film formation within a surface.

A first aspect according to an embodiment of the invention is a coater including: a droplet jet part which ejects droplets of a first solution toward an object to be coated to apply the droplets to the object to be coated; and a remoisturizing-drying part which gives a residue of the first solution applied on the object to be coated a solvent capable of dissolving the residue to form an applied body with a second solution containing the residue as a solute, and which dries the formed applied body with the second solution.

A second aspect according to an embodiment of the invention is a method for manufacturing a coated article including the steps of: ejecting droplets of a first solution toward an object to be coated to apply the droplets to the object to be coated; giving a residue of the first solution applied on the object to be coated a solvent capable of dissolving the residue to form an applied body with a second solution containing the residue as a solute; and drying the formed applied body with the second solution.

A third aspect according to an embodiment of the invention is a fluid blowing unit including a first block member, a second block member, a first spacer member, a second spacer member, and a lid member. The first block member is a rectangular parallelepiped member, and has: a first block main surface parallel to a longitudinal direction of the first block member; a first block longitudinal side surface perpendicular to the first block main surface and parallel to the longitudinal direction; a first block lateral side surface perpendicular to the first block main surface and parallel to a lateral direction of the first block member; a first block inclined surface continuously inclined from the first block main surface to the first block longitudinal side surface; a first block passage extending from the first block lateral side surface in the longitudinal direction; and a plurality of first block narrow passages which are narrower than the first block passage, each of which extends from the first block main surface in a direction perpendicular to the first block passage, which are in communication with the first block passage, and which are arranged side by side in the longitudinal direction. The second block member is a rectangular parallelepiped member, and has: a second block main surface parallel to a longitudinal direction of the second block member; a second block longitudinal side surface perpendicular to the second block main surface and parallel to the longitudinal direction; a second block lateral side surface perpendicular to the second block main surface and parallel to a lateral direction of the second block member; a second block inclined surface continuously inclined from the second block main surface to the second block longitudinal side surface; a second block passage extending from the second block lateral side surface in the longitudinal direction; and a plurality of second block narrow passages which are narrower than the second block passage, each of which extends from the second block main surface in a direction perpendicular to the second block passage, which are in communication with the second block passage, and which are arranged side by side in the longitudinal direction. The first spacer member is a plate-like member, is located at one end in the longitudinal direction of the first block member and the second block member with the first block longitudinal side surface facing the second block longitudinal side surface, and is airtightly provided between the first block longitudinal side surface and the second block longitudinal side surface with a plate-thickness direction of the first spacer member being perpendicular to the first block longitudinal side surface and the second block longitudinal side surface. The second spacer member is a plate-like member having a same thickness as the first spacer member has, is located at the other end opposite to the one end, and is airtightly provided between the first block longitudinal side surface and the second block longitudinal side surface with a plate-thickness direction of the second spacer member being perpendicular to the first block longitudinal side surface and the second block longitudinal side surface. The lid member is a rectangular parallelepiped member, has a depression portion extending in the longitudinal direction, and is provided on the first block main surface and the second block main surface in the first block member and the second block member that are assembled with the first spacer member and the second spacer member interposed in between, so that the depression portion covers the plurality of first block narrow passages and the plurality of second block narrow passages.

BEST MODES FOR CARRYING OUT THE INVENTION (First Embodiment)

A first embodiment according to the present invention will be described with reference to FIG. 1 to FIG. 7.

Figure 1:
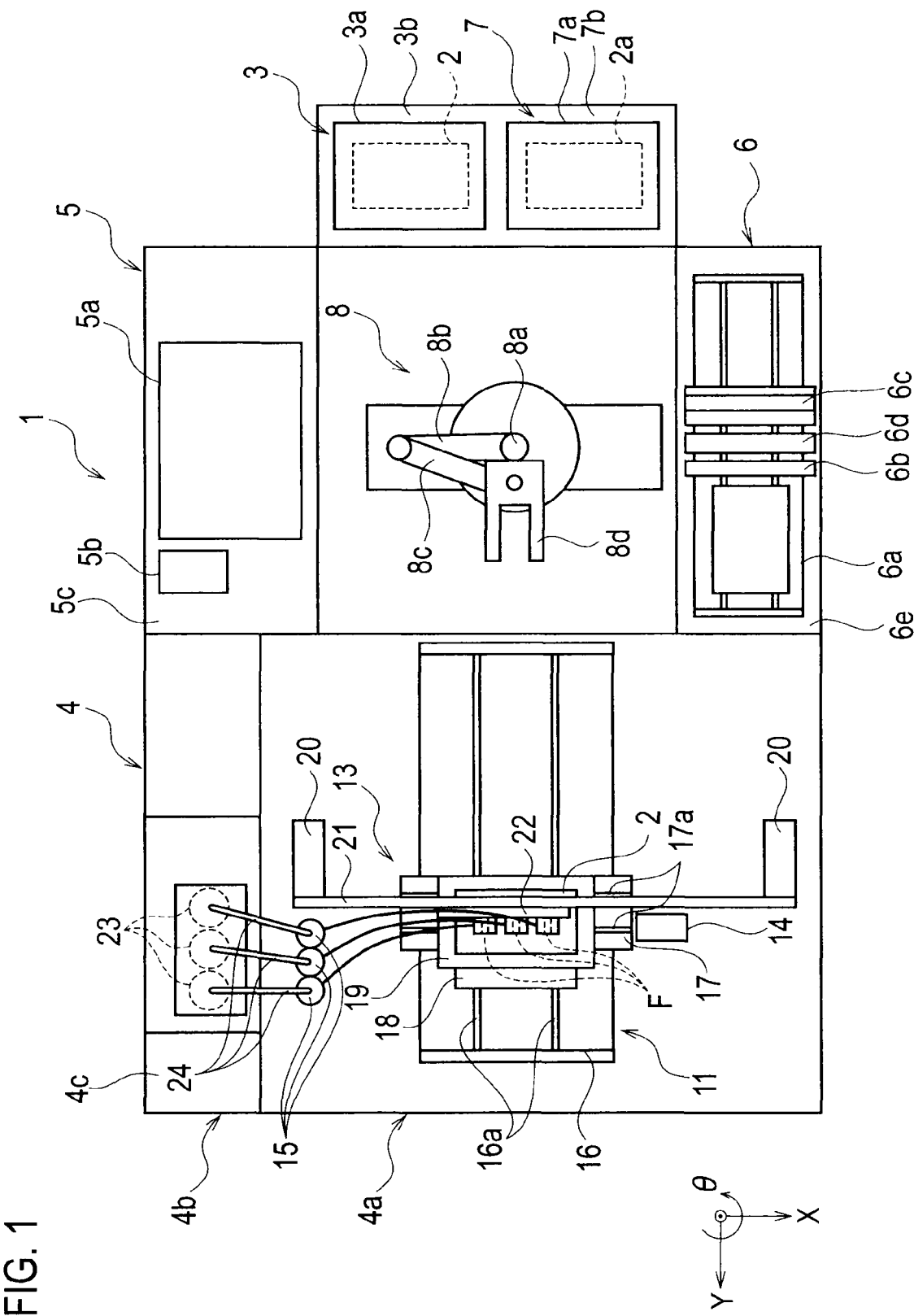
FIG. 1 is a plan view schematically showing a configuration of a coater according to a first embodiment of the present invention.

As shown in FIG. 1, a coater 1 according to the first embodiment of the present invention includes: a substrate accommodating part 3 which accommodates a substrate 2 which is an object to be coated; a droplet jet module 4 as a droplet jet part which ejects a solution (first solution) such as an ink in the form of a plurality of droplets to the substrate 2, and coats the substrate 2 with each droplet; a reduced pressure-drying module 5 as a reduced pressure-dryer which performs reduced pressure drying on the substrate 2 after the coating; a remoisturizing-drying module 6 as a remoisturizing-drying part which performs redissolution and re-drying on the substrate 2 subjected to the reduced pressure drying; a coated article-accommodating part 7 which accommodates a coated article 2a which is the substrate 2 subjected to the redissolution and re-drying; and a conveyor 8 which conveys the substrate among the substrate accommodating part 3, the droplet jet module 4, the reduced pressure-drying module 5, the remoisturizing-drying module 6, and the coated article-accommodating part 7.

The substrate accommodating part 3 includes an accommodation shelf 3a having a hierarchy structure for accommodating a plurality of the substrates 2. This accommodation shelf 3a is removably attached to a mount 3b. Such a substrate accommodating part 3 accommodates a plurality of the substrates 2 with one substrate being placed on each stage of the accommodation shelf 3a. Note that the substrates 2 within the accommodation shelf 3a are conveyed to the droplet jet module 4 by the conveyor 8.

The droplet jet module 4 is provided on a mount 4c, and includes: an ink coating box 4a which ejects and applies droplets of an ink toward the substrate 2; and an ink supply box 4b which supplies the ink to the ink coating box 4a. The ink coating box 4a includes a plurality of droplet jet heads F which eject droplets. In such a droplet jet module 4, the ink sent from the ink supply box 4b is ejected in the form of droplets (ink droplets) through each droplet jet head F, and applied to the surface of the substrate 2 in a predetermined dot pattern. Within the ink coating box 4a, the humidity is maintained constant, for example, at approximately 70%. This suppresses drying of each droplet landed on the substrate 2 during the coating of the substrate 2 and during conveying of the substrate 2. The coated substrate 2 is conveyed from the droplet jet module 4 to the reduced pressure-drying module 5 by the conveyor 8.

The reduced pressure-drying module 5 includes: an accommodating chamber 5a such as a vacuum chamber which accommodates the coated substrate 2; and an exhaust part 5b which exhausts gas within the accommodating chamber 5a. This reduced pressure-drying module 5 is provided on amount 5c. In such a reduced pressure-drying module 5, gas within the accommodating chamber 5a is exhausted by the exhaust part 5b, and the pressure within the accommodating chamber 5a is reduced. A solvent of each droplet on the coated substrate 2 accommodated within the accommodating chamber 5a is evaporated. Thereby, each droplet on the substrate 2 dries, and a residue made up of a solute and a small amount of a solvent component remains on the substrate 2. The dried substrate 2 is conveyed from the reduced pressure-drying module 5 to the remoisturizing-drying module 6 by the conveyor 8.

The remoisturizing-drying module 6 is provided on a mount 6e, and includes: a substrate moving mechanism 6a which holds and moves the substrate 2; a dissolution-blower 6b which blows a dissolution gas to the coated surface of the moving substrate 2; a dry-blower 6c which is provided downstream of the dissolution-blower 6b in the moving direction of the substrate 2 and blows a drying gas to the coated surface on the moving substrate 2; and an exhaust part 6d which exhausts gas between the dissolution-blower 6b and a dry-blower 6c. In the remoisturizing-drying module 6, the dissolution gas is blown to the coated surface of the substrate 2 by the dissolution-blower 6b, while the substrate moving mechanism 6a moves the substrate 2. Then, the drying gas is blown to the coated surface of the substrate 2 by the dry-blower 6c. Thereby, each residue (group of residues of the first solution), which remains on the substrate 2 as a result of drying of each droplet by reduced pressure drying, is redissolved by a solvent component included in the dissolution gas. Accordingly, such residues are turned into a plurality of droplet objects (group of droplets of a second solution). Then, those droplet objects (applied body) are re-dried by the drying gas, to form groups of a plurality of solute objects that remain on the substrate 2. Here, remoisturizing refers to regaining of fluidity of a solute, which is a residue, by giving of a solvent, irrespective of kinds of the solute and the solvent. The dissolution gas is a gas that contains, as its components, a solvent capable of dissolving the residue, and the drying gas is a gas that dries the solvent taken into the droplet object. The redissolved and re-dried substrate 2 is conveyed to the coated article-accommodating part 7 from the remoisturizing-drying module 6 by the conveyor 8.

The coated article-accommodating part 7 has an accommodation shelf 7a having a hierarchical structure for accommodating the coated article 2a which is the redissolved and re-dried substrate 2. This accommodation shelf 7a is removably attached to a mount 7b. Such a coated article-accommodating part 7 accommodates the coated article 2a conveyed by the conveyor 8 from the remoisturizing-drying module 6 with one coated article 2a being placed on each stage of the accommodation shelf 7a.

The conveyor 8 has: an elevation shaft 8a movable in the vertical direction; links 8b and 8c which are connected to an upper end portion of the elevation shaft 8a, and which are rotatable within a level surface (X-Y plane); and an arm 8d attached to an end portion of the links 8b and 8c. By elevating the elevation shaft 8a and rotating links 8b and 8c, this conveyor 8 extracts the substrate 2 from the accommodation shelf 3a of the substrate accommodating part 3, and conveys the substrate 2 to the droplet jet module 4. Further, the conveyor 8 conveys the coated substrate 2 from the droplet jet module 4 to the reduced pressure-drying module 5, and places the substrate 2 within the accommodating chamber 5a. In addition, the conveyor 8 extracts the substrate 2 subjected to the reduced pressure drying from the inside of the reduced pressure-drying module 5, and places the substrate 2 in the remoisturizing-drying module 6. Finally, the conveyor 8 conveys the coated article 2a, which is the redissolved and re-dried substrate 2, to the coated article-accommodating part 7, and places the coated article 2a within the accommodation shelf 7a. When a plurality of the substrates 2 are conveyed, the conveyor 8 controls the plurality of the substrates 2 and handles one substrate at a time so that each substrate 2 may be conveyed to a different position in the above-mentioned order. Within such a conveyor 8, the humidity is maintained constant, for example, at approximately 70%. This can prevent each droplet on the substrate 2 from drying during conveying of the substrate 2.

Next, description will be given on the ink coating box 4a and the ink supply box 4b that the droplet jet module 4 includes.

Figure 2:
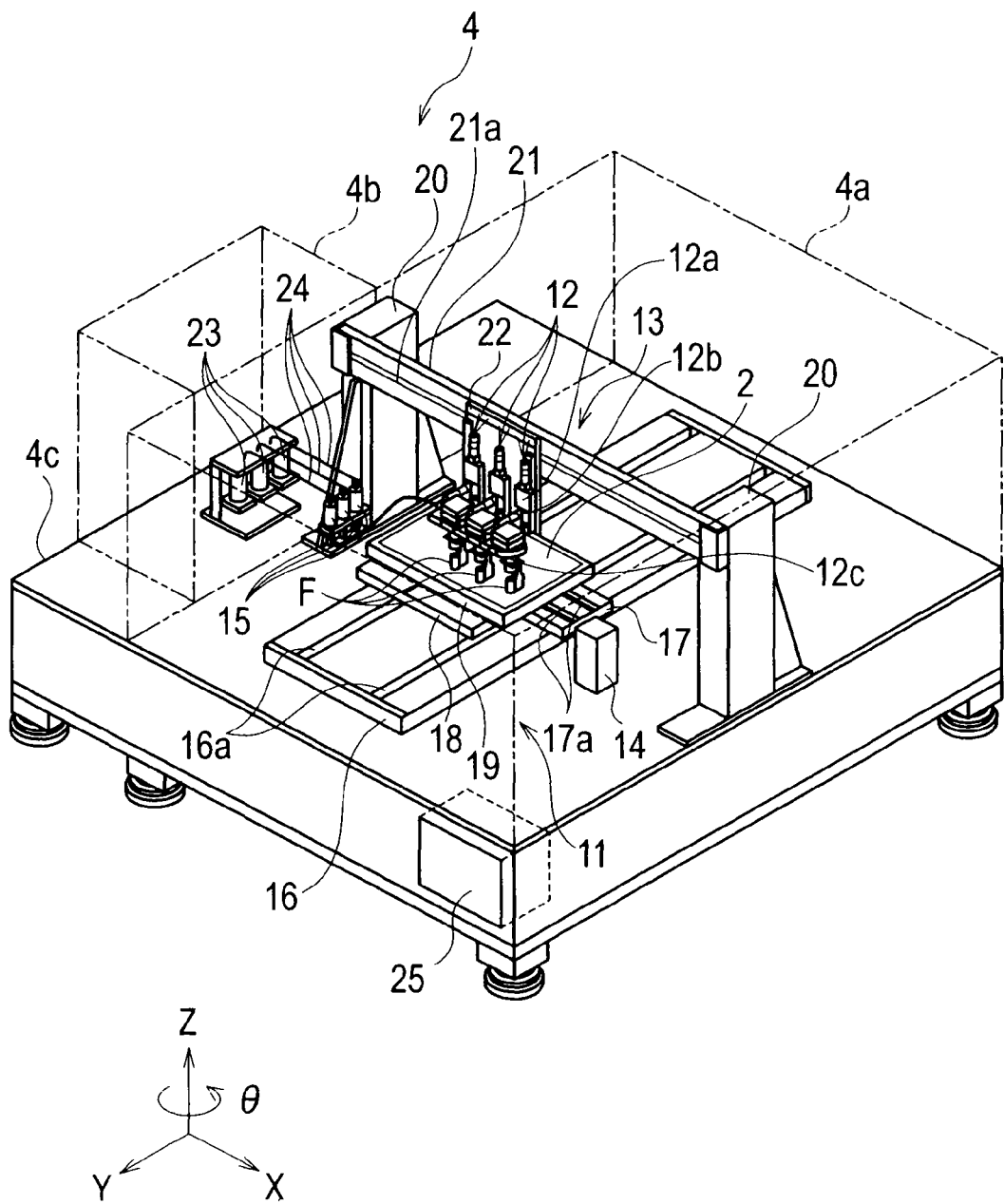
FIG. 2 is a perspective view schematically showing a configuration of a droplet jet module that the coater shown in FIG. 1 includes.

As shown in FIG. 2, within the ink coating box 4a, provided are: a substrate moving mechanism 11 which holds the substrate 2 and moves the substrate 2 in an X axis direction and in a Y axis direction; three ink jet head units 12 each having the droplet jet head F; a unit moving mechanism 13 which integrally moves those ink jet head units 12 in the X axis direction; a head maintenance unit 14 which cleans each droplet jet head F; and three ink buffer tanks 15, each of which accommodates an ink.

The substrate moving mechanism 11 is formed by stacking a Y-axis-direction guide plate 16, a Y-axis-direction moving table 17, an X-axis-direction moving table 18, and a substrate holding table 19. The Y-axis-direction guide plate 16, the Y-axis-direction moving table 17, the X-axis-direction moving table 18, and the substrate holding table 19 are each formed in a plate form.

The Y-axis-direction guide plate 16 is provided to be fixed to the upper surface of the mount 4c. A plurality of guide grooves 16a are provided on the upper surface of this Y-axis-direction guide plate 16 in the Y axis direction. These guide grooves 16a guide the Y-axis-direction moving table 17 in the Y axis direction.

The bottom surface of the Y-axis-direction moving table 17 has a plurality of projection portions (not shown) which engage with the respective guide grooves 16a. The Y-axis-direction moving table 17 is provided movably on the upper surface of the Y-axis-direction guide plate 16 in the Y axis direction. Moreover, a plurality of guide grooves 17a are provided on the upper surface of the Y-axis-direction moving table 17 in the X axis direction. Such a Y-axis-direction moving table 17 is moved in the Y axis direction along each guide groove 16a by a feed mechanism (not shown) in which a feed screw and a driving motor are used.

The bottom surface of the X-axis-direction moving table 18 has projection portions (not shown) which engage with the respective guide grooves 17a. The X-axis-direction moving table 18 is provided movably on the upper surface of the Y-axis-direction moving table 17 in the X axis direction. This X-axis-direction moving table 18 is moved in the X axis direction along each guide groove 17a by a feed mechanism (not shown) in which a feed screw and a driving motor are used.

The substrate holding table 19 is provided to be fixed to the upper surface of the X-axis-direction moving table 18. This substrate holding table 19 includes an adsorbing mechanism (not shown) which adsorbs the substrate 2. The adsorbing mechanism fixes and holds the substrate 2 on the upper surface thereof. As the adsorbing mechanism, for example, an air adsorption mechanism and the like are used. Note that the substrate holding table 19 reciprocally moves together with the X-axis-direction moving table 18 in the Y axis direction, and moves between a coating position (position of the substrate 2 in FIG. 1 and FIG. 2) where ink droplets are applied to the substrate 2 and a mounting position where the substrate 2 is mounted on the substrate holding table 19 or removed therefrom.

The unit moving mechanism 13 has: a pair of columns 20 erected on the upper surface of the mount 4c; an X-axis-direction guide plate 21 which is connected between upper end portions of those columns 20, and which extends in the X axis direction; and a base plate 22 which is provided in the X-axis-direction guide plate 21 so as to movable in the X axis direction, and which supports each ink jet head unit 12.

The pair of columns 20 are provided in the X axis direction so as to interpose the Y-axis-direction guide plate 16 therebetween. A guide groove 21a is provided on a top surface of the X-axis-direction guide plate 21 in the X axis direction. This guide groove 21a guides the base plate 22 in the X axis direction. The back surface of the base plate 22 has a projection portion (not shown) which engages with the guide groove 21a. The base plate 22 is provided movably in the X axis direction in the X-axis-direction guide plate 21. This base plate 22 is moved in the X axis direction along the guide groove 21a by a feed mechanism (not shown) in which a feed screw and a driving motor are used. The three ink jet head units 12 are attached to the top surface of such a base plate 22.

Each of the ink jet head units 12 is vertically installed in the base plate 22, and includes the droplet jet head F. Each of these droplet jet heads F is removably provided at an end of each ink jet head unit 12. The droplet jet head F has a plurality of nozzles, which are through holes, and ejects droplets from each of those nozzles toward the substrate 2. In such an ink jet head unit 12, provided are: a Z-axis-direction moving mechanism 12a which moves the droplet jet head F vertically to the surface of the substrate 2, i.e., in a Z axis direction; a Y-axis-direction moving mechanism 12b which moves the droplet jet head F in the Y axis direction; and a θ-direction rotating mechanism 12c which rotates the droplet jet head F in a θ direction. Thereby, the droplet jet head F is movable in the Z axis direction and in the Y axis direction, and rotatable in the θ axis direction.

The head maintenance unit 14 is arranged on an extension line of a moving direction of each ink jet head unit 12, and spaced from the Y-axis-direction guide plate 16. This head maintenance unit 14 cleans the droplet jet head F of each ink jet head unit 12. Note that the head maintenance unit 14 automatically cleans each droplet jet head F in a state that the droplet jet head F of each ink jet head unit 12 stops at a standby position facing the head maintenance unit 14.

The ink buffer tank 15 uses a hydraulic head difference (hydraulic head pressure) between a surface of the ink stored in the ink buffer tank 15 and a nozzle surface of the droplet jet head F, to adjust a surface (meniscus) of the ink at a nozzle tip. Thereby, leakage and poor ejection of the ink are prevented.

A plurality of ink tanks 23 each of which accommodates an ink are removably attached within the ink supply box 4b. Each ink tank 23 is connected to the droplet jet head F through the ink buffer tank 15 by a delivery pipe 24. In other words, the droplet jet head F is supplied with the ink from the ink tank 23 through the ink buffer tank 15.

A controller 25 for controlling each part of the coater 1 and a storage unit (not shown) which stores various kinds of programs are provided within the mount 4c. On the basis of the various kinds of programs, the controller 25 controls movement of the Y-axis-direction moving table 17, movement of the X-axis-direction moving table 18, movement of the base plate 22, drive of the Z-axis-direction moving mechanism 12a, drive of the Y-axis-direction moving mechanism 12b, drive of the θ-direction rotating mechanism 12c, etc. Thereby, the relative position of the substrate 2 on the substrate holding table 19 and the droplet jet head F of each ink jet head unit 12 can be changed variously. Furthermore, on the basis of various kinds of programs, the controller 25 controls drive of the reduced pressure-drying module 5, drive of the remoisturizing-drying module 6, drive of the conveyor 8, etc.

Next, description will be given on the accommodating chamber 5a and the exhaust part 5b which the reduced pressure drying module 5 includes.

Figure 3:
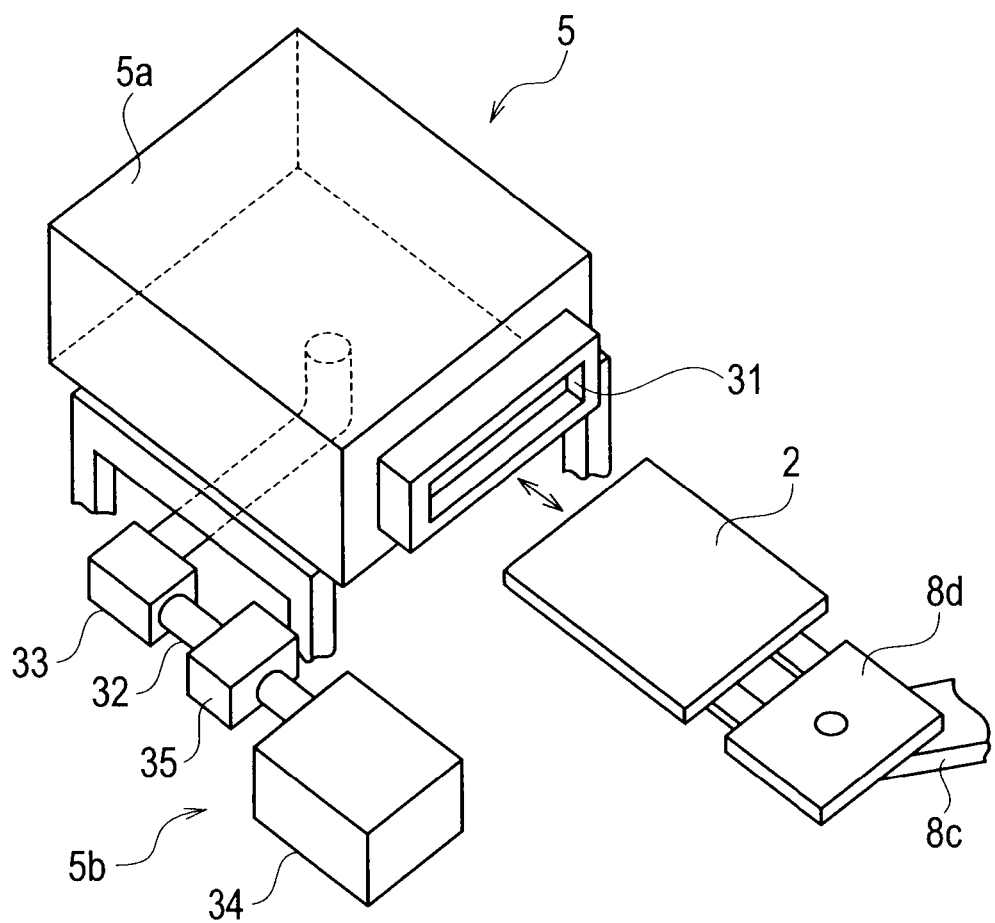
FIG. 3 is a perspective view schematically showing a configuration of a reduced pressure-drying module that the coater shown in FIG. 1 includes.

As shown in FIG. 3, the accommodating chamber 5a is formed into a box form having a door 31 which can be opened and closed. Through this door 31, the coated substrate 2 is accommodated into the accommodating chamber 5a. First, the door 31 is opened, the coated substrate 2 is accommodated into the accommodating chamber 5a, and subsequently, the door 31 is closed for airtightness. After drying, the door 31 is opened again, and the dried substrate 2 is extracted therefrom. Note that the substrate 2 is supported by a supporting pin or the like provided on the bottom surface of the accommodating chamber 5a. A distribution plate (not shown) having a plurality of through holes is provided in the accommodating chamber 5a. Thereby, generation of air current within the accommodating chamber 5a can be suppressed.

The exhaust part 5b has: an exhaust pipe 32 which is an exhaust route connected to the bottom surface of the accommodating chamber 5a; an opening/closing valve 33 which opens and closes the exhaust pipe 32; a suction part 34 which sucks a gas within the accommodating chamber 5a through the exhaust pipe 32; a reduced pressure tank 35 which is located between the opening/closing valve 33 and the suction part 34, and which is provided in the exhaust route. This exhaust part 5b is formed to be capable of changing an exhaust speed, an ultimate vacuum, etc.

The exhaust pipe 32 is connected to approximately the center of the bottom surface of the accommodating chamber 5a. The opening/closing valve 33 is controlled by the controller 25 and opens and closes the exhaust pipe 32. As this opening/closing valve 33, for example, a butterfly valve, a solenoid valve, or the like is used. The suction part 34 is connected to the accommodating chamber 5a with the exhaust pipe 32 through the opening/closing valve 33 and the reduced pressure tank 35. As this suction part 34, for example, a suction pump or the like is used. Such a suction part 34 is controlled by the controller 25 and sucks and exhausts a gas within the accommodating chamber 5a and the reduced pressure tank 35 through the exhaust pipe 32. The reduced pressure tank 35 is sucked by the suction part 34 to, for example, a predetermined vacuum pressure of several kPa, and brought into a vacuum state.

In such a reduced pressure-drying module 5, the inside of the reduced pressure tank 35 is brought into a predetermined vacuum pressure by the exhaust part 5b. Then, the exhaust pipe 32 is opened by the opening/closing valve 33, and a gas is exhausted from the inside of the accommodating chamber 5a to bring the accommodating chamber 5a into a vacuum state. Thereby, each droplet on the coated substrate 2 is dried, and a plurality of residues remain on the substrate 2.

Next, with reference to FIG. 4 and FIG. 5, description will be given on the substrate moving mechanism 6a, the dissolution-blower 6b, the dry-blower 6c, and the exhaust part 6d that the remoisturizing-drying module 6 includes.

The remoisturizing-drying module 6 is to provide a process for: applying a solvent capable of dissolving solutes of many fine lumps disposed on the object to be coated so as to regain the fluidity of the solute within each lump; giving an uniform dry state to the groups of the fine solutes each having own fluidity; and drying the solutes again. For this reason, necessary are: a mechanism which relatively displaces the substrate and a remoisturizing unit for giving the fluidity to the solutes by giving the solvent while keeping the individuality of the lumps of the solutes; and a mechanism which relatively displaces the substrate and a drying unit for evaporating the solvent from each of the lumps of the solutes to which the fluidity is given. Means for implementing this can be formed in a way that, while the object to be coated is fixed, the remoisturizing unit and the drying unit may be displaced in parallel to the surface of the object to be coated. In the present embodiment, considering the simplicity and weight of a structure of an object to be moved, relative displacement of the object to be coated and the remoisturizing unit and that of the object to be coated and the drying unit are implemented by providing: a remoisturizing unit (dissolution-blower 6b) and a drying unit (dry-blower 6c) which are disposed fixedly and spaced from each other by a predetermined distance; and a table mechanism (substrate moving mechanism 6a) which communicates the remoisturizing unit and the drying unit with each other and moves a table in a monoaxial direction.

Figure 4:
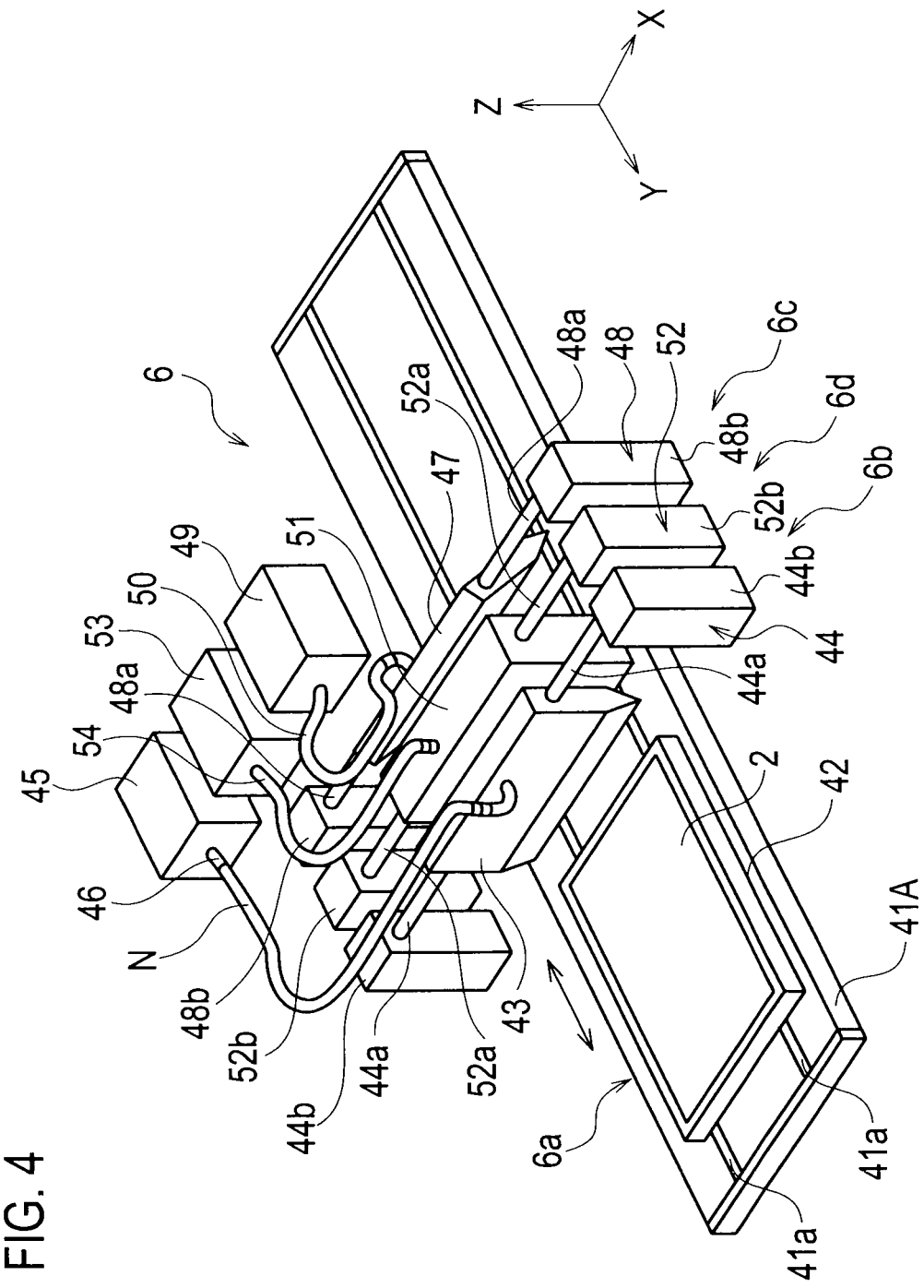
FIG. 4 is a perspective view schematically showing a configuration of a remoisturizing-drying module which the coater shown in FIG. 1 includes.

As shown in FIG. 4, the substrate moving mechanism 6a is formed by stacking a Y-axis-direction guide plate 41A and a substrate holding table 42. This substrate moving mechanism 6a functions as a moving mechanism for relative movement of the substrate 2 with respect to the dissolution-blower 6b and the dry-blower 6c.

The Y-axis-direction guide plate 41A is provided to be fixed on the upper surface of the mount 6e. A plurality of guide grooves 41a are provided on the upper surface of this Y-axis-direction guide plate 41A in parallel to a Y axis direction. These guide grooves 41a guide the substrate holding table 42 in the Y axis direction.

The substrate holding table 42 is provided movably in the Y axis direction along each guide groove 41a on the upper surface of the Y-axis-direction guide plate 41A. This substrate holding table 42 is moved in the Y axis direction along each guide groove 41a by a feed mechanism (not shown) in which a feed screw and a driving motor are used. The substrate holding table 42 also includes an adsorbing mechanism (not shown) which adsorbs the substrate 2, and the substrate 2 is fixed to the upper surface of the substrate holding table 42 by the adsorbing mechanism and held thereto. As the adsorbing mechanism, an air adsorbing mechanism or the like is used, for example. Further, the substrate holding table 42 includes a plurality of supporting pins which support the substrate 2 and which may project and retract. When the substrate 2 is passed, the substrate 2 is supported by those supporting pins. Such a substrate holding table 42 reciprocally moves in the Y axis direction, and moves between a mounting position where the substrate 2 subjected to reduced pressure drying is placed and a passing position where the coated article 2a, i.e., the redissolved and re-dried substrate 2, is passed. Note that the moving speed of the substrate holding table 42 is approximately several tens of mm/s, for example.

The dissolution-blower 6b includes: a dissolution-blowing head 43 which blows a dissolution gas to the substrate 2 on the substrate holding table 42; a supporter 44 which supports the dissolution-blowing head 43 facing the substrate moving mechanism 6a; a dissolution gas-supplier 45 which supplies the dissolution gas to the dissolution-blowing head 43; and a dissolution gas-supplying pipe 46 which connects the dissolution-blowing head 43 to the dissolution gas-supplier 45, and through which the dissolution gas passes. This dissolution-blower 6b is formed so that the concentration, the volume, and the like of the dissolution gas are changeable.

Figure 5:
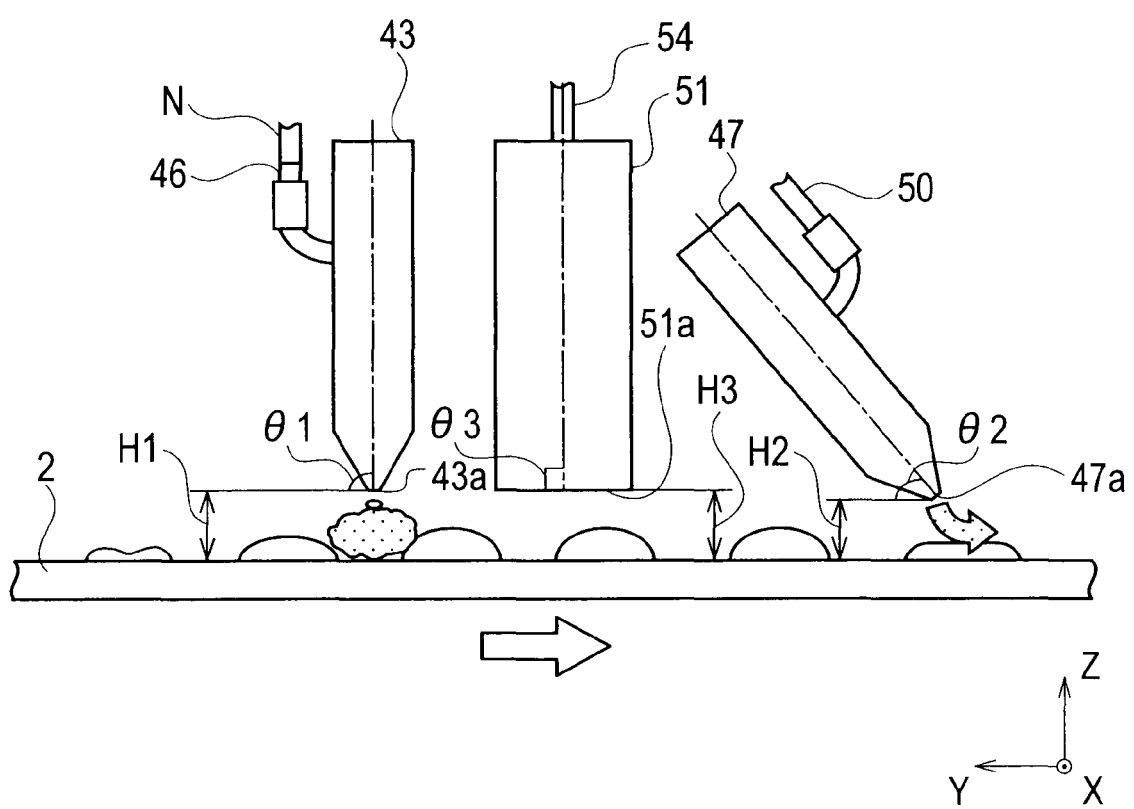
FIG. 5 is a side view schematically showing a configuration of a portion of the remoisturizing-drying module shown in FIG. 4.

The dissolution-blowing head 43 is formed into a box form having an open blowing port 43a (see FIG. 5). This blowing port 43a is formed into a slit shape. As shown in FIG. 5, such a dissolution-blowing head 43 blows the dissolution gas from the blowing port 43a, and blows the gas to each residue on the moving substrate 2. By this dissolution gas, each residue on the substrate 2 is redissolved and turned into a plurality of droplet objects. Here, a spacing distance H1 between the dissolution-blowing head 43 and the surface of the substrate 2 is, for example, approximately several mm. Moreover, a blowing angle θ1 is, for example, approximately 90°, the blowing angle θ1 being an angle that a vector in a direction to blow a dissolution gas to the substrate 2 makes with a vector in a direction of relative movement of the substrate 2 included in a plane of the substrate 2 (see FIG. 5).

The supporter 44 is formed of: a pair of arm members 44a fixed and attached to the dissolution-blowing head 43; and a pair of columns 44b which respectively support those arm members 44a. The pair of arm members 44a connect the dissolution-blowing head 43 to the pair of columns 44b. Moreover, the pair of columns 44b are erected on the upper surface of the mount 6e. These columns 44b rotatably support the pair of arm members 44a, and further, movably support those arm members 44a in a height direction of the pair of columns 44b. In other words, the dissolution-blowing head 43 is formed so that the relative position of the dissolution-blowing head 43 with respect to the substrate 2 on the substrate holding table 42, for example, the blowing angle θ1 with respect to the substrate 2, the spacing distance H1 to the substrate 2, etc are changeable. Therefore, the blowing angle θ1 is adjusted by rotation of the pair of arm members 44a, and the spacing distance H1 is adjusted by movement of the pair of columns 44b.

The dissolution gas-supplier 45 is a unit which accommodates a dissolution gas and supplies the dissolution gas to the dissolution-blowing head 43 through the dissolution gas-supplying pipe 46 using a blast pump, etc. Here, as the dissolution gas, used is a gas containing a solvent in which the solute of the ejected droplets is dissolved, for example, a gas containing a solvent such as water. Note that the sectional shape in a thickness direction of each solute object that remains on the substrate 2 can be adjusted by adjusting the concentration, the volume (=average air velocity×opening area of the blowing port 43a), etc. of this dissolution gas. For example, the air velocity is approximately several m/s. In addition, the following configuration can be made: a liquefied solvent may be kept without using a vaporized solvent, and the solvent is vaporized when necessary.

The dissolution gas-supplying pipe 46 is a passage for connecting the dissolution-blowing head 43 to the dissolution gas-supplier 45, and for supplying the dissolution gas to the dissolution-blowing head 43 from the dissolution gas-supplier 45. As this dissolution gas-supplying pipe 46, for example, a tube, a pipe, etc. are used. A heater N which supplies heat is provided on an outer circumferential surface of such a dissolution gas-supplying pipe 46. As this heater N, a sheet-like heater is used, and is wound around the outer circumferential surface of the dissolution gas-supplying pipe 46. By controlling heat generation of this heater N, the temperatures of the dissolution gas-supplying pipe 46 and an atmosphere within the pipe are maintained higher than a dew-point temperature of the circulating gas. As a result, dew condensation and misting of the solvent within the pipe are prevented, thereby making it easy to maintain the solvent concentration of the dissolution gas constant. Particularly, since mist is a state where a liquid is drifting in the air in a mist form, the prevention of the misting allows suppression of adhesion of the liquid onto the substrate 2 or onto other unit portions.

The dry-blower 6c includes: a dry-blowing head 47 which blows a drying gas to the substrate 2 on the substrate holding table 42; a supporter 48 which supports the dry-blowing head facing the substrate moving mechanism 6a; a drying gas-supplier 49 which supplies the drying gas to the dry-blowing head 47; and a drying gas-supplying pipe 50 which connects the dry-blowing head 47 to the drying gas-supplier 49, and through which the drying gas passes. This dry-blower 6c is formed so that the concentration, the volume, and the like of the drying gas are changeable.

The dry-blowing head 47 is formed into a box form having an open blowing port 47a (see FIG. 5). This blowing port 47a is formed into a slit shape. As shown in FIG. 5, such a dry-blowing head 47 blows the drying gas from the blowing port 47a, and blows the drying gas to each droplet object on the moving substrate 2. Each droplet object is re-dried by this drying gas and turned into a plurality of solute objects that remain on the substrate 2. Here, a spacing distance H2 between the dry-blowing head 47 and the surface of the substrate 2 is, for example, approximately several mm to several tens mm. Moreover, a blowing angle θ2 is, for example, approximately 40° to 70°, the blowing angle θ2 being an angle that a vector in a direction to blow a drying gas to the substrate 2 makes with a vector in a direction of relative movement of the substrate 2 included in a plane of the substrate 2 (see FIG. 5).

The supporter 48 is formed of: a pair of arm members 48a fixed and attached to the dry-blowing head 47; and a pair of columns 48b which respectively support those arm members 48a. The pair of arm members 48a connect the dry-blowing head 47 to the pair of columns 48b. Moreover, the pair of columns 48b are erected on the upper surface of the mount 6e. These columns 48b rotatably support the pair of arm members 48a, and further, movably support those arm members 48a in a height direction of the pair of columns 48b. In other words, the dry-blowing head 47 is formed so that the relative position of the dry-blowing head 47 with respect to the substrate 2 on the substrate holding table 42, for example, the blowing angle θ2 with respect to the substrate 2, the spacing distance H2 to the substrate 2, etc are changeable. Therefore, the blowing angle θ2 is adjusted by rotation of the pair of arm members 48a, and the spacing distance H2 is adjusted by movement of the pair of columns 48b.

The drying gas-supplier 49 is a unit which accommodates a drying gas and supplies the drying gas to the dry-blowing head 47 through the drying gas-supplying pipe 50 using a blast pump, etc. Here, as the drying gas, used is a gas in a dried state such as nitrogen (N2), for example. Note that the sectional shape in a thickness direction of each solute object that remains on the substrate 2 can be adjusted by adjusting the concentration, the volume (=average air velocity×opening area of the blowing port 47a), etc. of this drying gas. For example, the air velocity is approximately several m/s.

The drying gas-supplying pipe 50 is a passage for connecting the dry-blowing head 47 to the drying gas-supplier 49, and for supplying the drying gas to the dry-blowing head 47 from the drying gas-supplier 49. As this drying gas-supplying pipe 50, for example, a tube, a pipe, etc. are used.

The exhaust part 6d includes: a suction head 51 which sucks the gas between the dissolution-blowing head 43 and the dry-blowing head 47; a supporter 52 which supports the suction head 51 facing the substrate moving mechanism 6a; a suction part 53 which supplies a suction force to the suction head 51; and an exhaust pipe 54 which connects the suction head 51 to the suction part 53, and through which the sucked gas passes. This exhaust part 6d is formed so that the change in the volume of the sucked gas, i.e., the suction force is changeable.

The suction head 51 is formed into a box form having an open intake port 51a (see FIG. 5). This intake port 51a is formed into, for example, a rectangular shape. As shown in FIG. 5, such a suction head 51 sucks the gas from the intake port 51a. Thereby, the gas between the dissolution-blowing head 43 and the dry-blowing head 47 is sucked, so that increasing of humidity therebetween is suppressed and diffusion of a high humidity atmosphere is suppressed. Here, a spacing distance H3 between the suction head 51 and the surface of the substrate 2 is, for example, approximately several mm to several tens mm. Moreover, an intake angle θ3 is, for example, approximately 90°, the intake angle θ3 being an angle with respect to the substrate 2, and being an angle that a vector in a direction to suck a gas makes with a vector in a direction of relative movement of the substrate 2 included in a plane of the substrate 2 (see FIG. 5).

Note that, within the suction head 51, one or more (for example, three) porous plates each having a plurality of through holes may be provided approximately in parallel to an opening surface of the intake port 51a. Particularly, when a plurality of the porous plates are provided, those porous plates are disposed so that the number of the through holes can decrease toward an exhaust port from the intake port 51a. The exhaust port of the suction head 51 is an opening connected to the exhaust pipe 54. Thus, by providing the porous plates in this manner, air velocity distribution can be eliminated, and uniform suction can be performed from the intake port 51a. Note that, when humidity distribution is large, the number of the through holes of the porous plate, the position where the through holes are formed, etc. may be adjusted in accordance with the humidity distribution to form the air velocity distribution. For example, when the humidity near both sides of the intake port 51a is low and the humidity near the center of the intake port 51a is high, the air velocity distribution is formed so that the humidity of the both sides of the intake port 51a can be low and that the humidity at the central portion of the intake port 51a can be high.

The supporter 52 is formed of: a pair of arm members 52a fixed and attached to the suction head 5; and a pair of columns 52b which respectively support those arm members 52a. The pair of arm members 52a connects the suction head 51 to the pair of columns 52b. Moreover, the pair of columns 52b are erected on the upper surface of the mount 6e. These columns 52b rotatably support the pair of arm members 52a, and further, movably support those arm members 52a in a height direction of the pair of columns 52b. In other words, the suction head 51 is formed so that the relative position of the suction head 51 with respect to the substrate 2 on the substrate holding table 42, for example, the intake angle θ3 with respect to the substrate 2, the spacing distance H3 to the substrate 2, etc are changeable. Therefore, the intake angle θ3 is adjusted by rotation of the pair of arm members 52a, and the spacing distance H3 is adjusted by movement of the pair of columns 52b.

The suction part 53 is a unit which supplies a suction force to the suction head 51 through the exhaust pipe 54 using an exhaust pump, etc. Note that the sectional shape in the thickness direction of each solute object that remains on the substrate 2 can be adjusted by adjusting this suction force, i.e., the volume of the gas to be sucked (=average air velocity×opening area of the intake port 51a). For example, the air velocity is approximately several m/s.

The exhaust pipe 54 is a passage for connecting the suction head 51 to the suction part 53 and for exhausting the gas sucked by the suction head 51. As this exhaust pipe 54, for example, a tube, a pipe, etc. are used.

Next, description will be given on a droplet coating process of the above-mentioned coater 1, i.e., a manufacturing process of the coated article (product) 2a by the coater 1. The controller 25 of the coater 1 executes the droplet coating process on the basis of various kinds of programs.

The manufacturing process of the coated article 2a comprises: a coating process in which an ink, the first solution having a solute contained in the first solvent, is ejected in the form of droplets toward the substrate 2, and the plurality of the droplets are applied to the substrate 2; a drying process in which the first solvent is evaporated from each droplet on the substrate 2; and a remoisturizing and drying process in which each residue (group of the residues of the first solution), remaining on the substrate 2 after each droplet is dried, is redissolved with the second solvent to thereby form droplet objects (group of droplets of the second solution) that is the second solution containing the residue, and then each droplet object formed on the substrate 2 is dried again (see FIG. 5). Note that the remoisturizing and drying process includes: a dissolution-blowing step of blowing a dissolution gas to each residue remaining on the substrate 2 to form each liquid droplet object; and a dry-blowing step of blowing a drying gas to each droplet object on the resultant substrate 2.

Here, the main component of the ink includes a solute that remains on the substrate 2 as the residue and a solvent that dissolves (or disperses) the solute. This ink includes, for example, water and a water-absorbing low-vapor-pressure solvent (for example, EG, etc.), as well as a water soluble polymer material (for example, PVP: polyvinylpyrrolidone and PVA: polyvinyl alcohol, etc), a water-soluble film material, or the like, as an additive. The added water soluble polymer material functions as a pinning agent that fixes the landing diameter, formed by an edge of the droplet, to a position closest to the maximum diameter thereof when the droplet lands and spreads.

A surfactant that remains on the substrate 2 as a part of the residue is added to this ink as a solute. This surfactant is a material having a mass such that the material does not volatilize in the reduced pressure drying process. In addition, as the surfactant, a surfactant having action to significantly reduce the surface tension of the second solvent is selected. For example, when water is used, preferably, anionic surfactants such as ammonium polyacrylate are used.

By adding the surfactant to the solution, the surfactant can also be dissolved simultaneously at the time of redissolution of each residue to reduce the surface tension of the droplet objects. Thereby, other solutes are easily deposited uniformly without gathering to the central portion of the droplet when the droplet is dried. Accordingly, the film thickness distribution becomes uniform, and a flat coating film (for example, thin film) is easily formed. Particularly, use of water as the solvent makes the surface tension of the droplet object larger, and shows a tendency to form a film having a larger thickness on the periphery thereof. However, addition of the surfactant to the solution allows formation of flat solute objects (for example, thin film).

The surfactant is added for the purpose of significantly reducing the surface tension of the solvent, and can be selected where relevant in accordance with the solvent within a range of the purpose. However, from the viewpoint of selecting a surfactant that does not cause chemical reaction with the first solute that composes the ink and each part of the coater 1, a surfactant in which alkali metals, metals, and halogens are used as a counterion of the surfactant is avoided, but use of a surfactant in which an ammonium ion, a tetramethyl ammonium ion, or the like is used is preferable.

Figure 6:
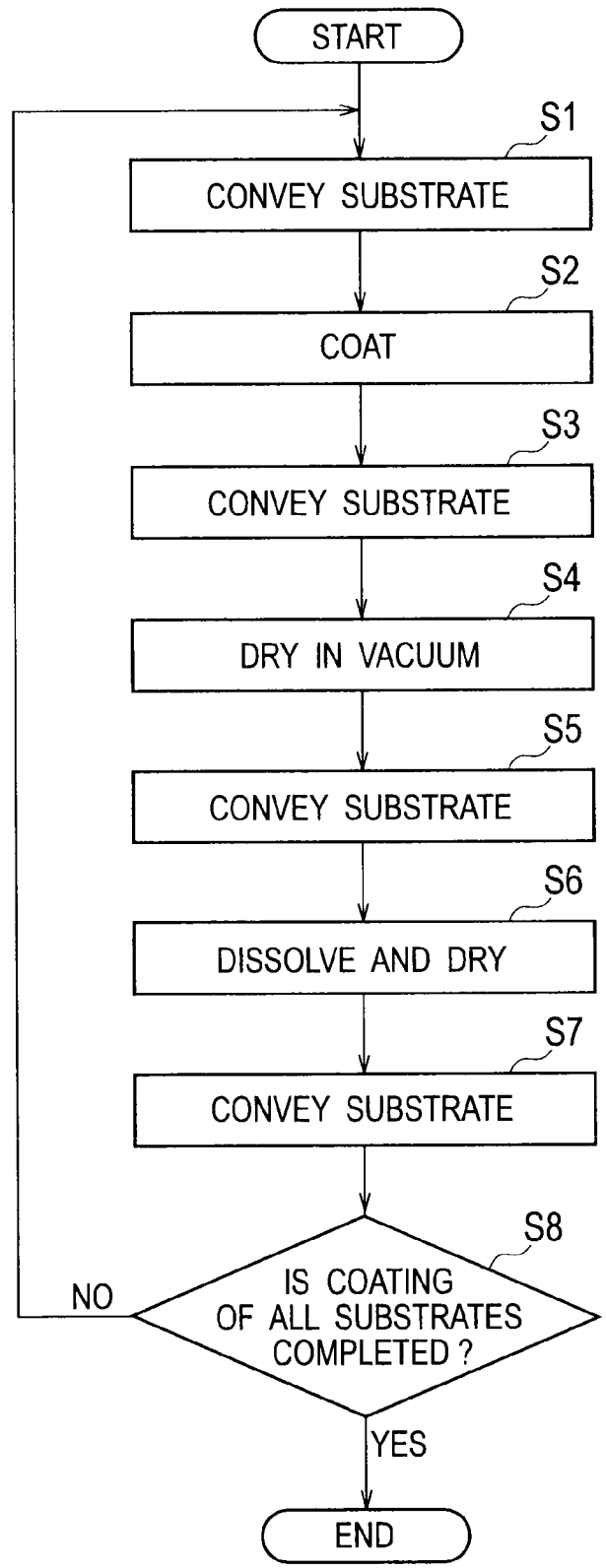
FIG. 6 is a flow chart that shows a flow of a droplet coating process of the coater shown in FIG. 1.

As shown in FIG. 6, the controller 25 controls the conveyor 8, so that the substrate 2 is extracted from the accommodation shelf 3a of the substrate accommodating part 3 and conveyed to the droplet jet module 4. Thus, the substrate 2 is placed on the substrate holding table 19 of the droplet jet module 4 (Step S1). At this time, the substrate holding table 19 stands by at the mounting position, and the substrate 2 is held on the substrate holding table 19 by the adsorbing mechanism.

Next, the controller 25 controls the droplet jet module 4, so that the droplets are ejected to the substrate 2 on the substrate holding table 19 for coating (Step S2). In detail, the controller 25 controls the droplet jet module 4, so that the substrate holding table 19 is moved from the mounting position to the coating position, and that each ink jet head unit 12 is moved from a standby position to a position facing the substrate 2. Then, the controller 25 controls the Y-axis-direction moving table 17 and the X-axis-direction moving table 18, and additionally controls the droplet jet head F of each ink jet head unit 12, for an ejection operation to eject the droplets to the substrate 2 by each droplet jet head F. Each droplet jet head F ejects the ink in the form of droplets from each nozzle thereof, and thereby those droplets are landed on the moving substrate 2, sequentially forming dot strings of a predetermined pattern. Then, the controller 25 returns each ink jet head unit 12 to the standby position, and moves the substrate holding table 19 from the coating position to the mounting position.

Figure 7:
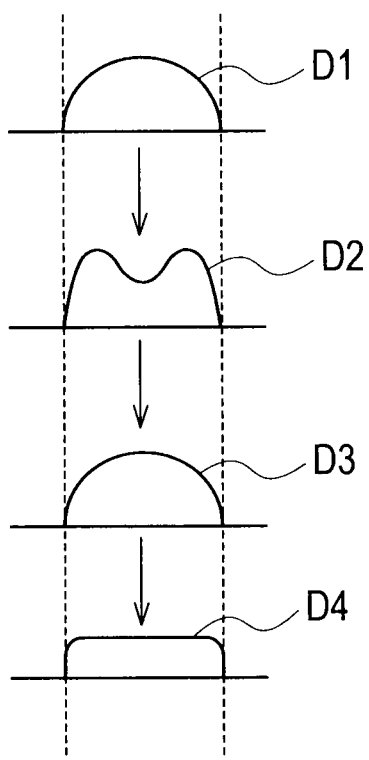
FIG. 7 is a schematic diagram showing a sectional shape in a thickness direction of droplets, which changes in accordance with the droplet coating process shown in FIG. 6.

Here, the sectional shape in the thickness direction of each droplet on the substrate 2 becomes semicircular as a sectional shape D1, as shown in FIG. 7. At this time, the landing diameter of the droplet (diameter) is fixed by the action of the pinning agent (PVP) contained in the droplet.

Then, the controller 25 controls the conveyor 8, so that the coated substrate 2 is extracted from the substrate holding table 19 that stands by at the mounting position, and conveyed to the reduced pressure-drying module 5. Thus, the substrate 2 is placed within the accommodating chamber 5a of the reduced pressure-drying module 5 (Step S3). This substrate 2 is accommodated and within the accommodating chamber 5a in a sealed state.

Next, the controller 25 controls the reduced pressure-drying module 5, so that reduced pressure drying is performed on each droplet on the coated substrate 2 accommodated within the accommodating chamber 5a (step S4). In detail, the controller 25 controls the exhaust part 5b as follows. First, the pressure within the reduced pressure tank 35 is made into a predetermined vacuum pressure of, for example, several kPa. Then, the exhaust pipe 32 is opened by the opening/closing valve 33 to exhaust the gas from the accommodating chamber 5a and make the inside of the accommodating chamber 5a vacuum. Thereby, the inside of the accommodating chamber 5a becomes vacuum, each droplet on the coated substrate 2 is dried, and a plurality of residues remain on the substrate 2.

Here, as shown in FIG. 7, the sectional shape in the thickness direction of each residue that remains on the substrate 2, especially, that of each residue on the periphery of the substrate 2 has a shape whose central portion is depressed as a sectional shape D2 with the landing diameter of the droplet before drying being maintained. At this time, the sectional shape in the thickness direction of each residue at the central portion of the substrate 2 is different from the sectional shape in the thickness direction of each residue on the periphery of the substrate 2.

Note that, when the substrate 2 is coated with the droplet, the landing diameter of the droplet is fixed by the action of PVP contained in the droplet. Then, before the reduced pressure drying causes degeneration accompanied with advance of slow drying, the solute contained in the droplet concentrates on the periphery of the droplet. While most water vaporizes at this time, a slight amount of the EG remains. Thus, since the residue is generated with the landing diameter of the droplet being maintained, the diameter of each residue on the substrate 2 can be made identical.

Subsequently, the controller 25 controls the conveyor 8, so that the dried substrate 2 is extracted from the accommodating chamber 5*a* of the reduced pressure-drying module 5, and conveyed to the remoisturizing-drying module 6. Thus, the substrate 2 is placed on the substrate holding table 42 of the remoisturizing-drying module 6 (Step S5). At this time, the substrate holding table 42 stands by at the mounting position, and the substrate 2 is held on the substrate holding table 42 by the adsorbing mechanism.

The controller 25 controls the remoisturizing-drying module 6, so that the dissolution gas is blown to a coated surface, which is the top surface of the substrate 2 on the moving substrate holding table 42, and subsequently the drying gas is blown thereto (Step S6). In detail, the controller 25 controls the substrate moving mechanism 6*a*. The controller 25 controls the dissolution-blower 6*b*, the dry-blower 6*c*, and the exhaust part 6*d* while moving the substrate holding table 42 from the mounting position to the passing position. The dissolution gas is blown to each residue subjected to the reduced pressure drying on the moving substrate 2. Continuously, the drying gas is blown to each dissolved droplet object on the moving substrate 2 while excessive dissolution gas is exhausted.

Thereby, each residue subjected to the reduced pressure drying is redissolved by the dissolution gas to be turned into each droplet object on the substrate 2. Subsequently, those droplet objects are re-dried by the drying gas to form each solute object (coating film) that remains on the substrate 2. At this time, the sectional shape in the thickness direction of each solute object at the central portion of the substrate 2 is identical to the sectional shape in the thickness direction of each solute object on the periphery of the substrate 2. In other words, the sectional shape in the thickness direction of each solute object after the re-drying is substantially identical irrespective of the landing position at the central portion, the periphery, and the like of the substrate 2. Moreover, diffusion of a high humidity atmosphere is also prevented by exhausting the excessive dissolution gas, which does not contribute to formation of each droplet object in the dissolution gas blown by the dissolution-blower 6*b*. Note that the drying gas blown toward each droplet object may be sucked and exhausted. In this case, diffusion of the drying gas and gas containing the solvent after contributing to drying is easily suppressed.

Here, as shown in FIG. 7, the sectional shape in the thickness direction of each droplet object becomes semicircular as a sectional shape D3 with the diameter of the droplet before the reduced pressure drying being maintained. This is because water is supplied to the EG within the residue by moisturizing, and the shape of the residue is reset to the original shape (sectional shape D1 shown in FIG. 7) with the landing diameter being maintained (this is referred to as remoisturizing). The liquid composition at this time contains more water and less EG than the initial composition. Moreover, the EG and the solute on the periphery of the droplet are distributed to the inside of the droplet by the redissolution. Note that, since more water is contained, the sectional shape is easily controlled by the humidity control at the time of re-drying. At this time, the shape does not need to completely return to the original shape at the time of landing. The shape may return to an extent that the solute regains its fluidity, and the shape is adjusted where relevant in accordance with properties of the solvent used in the remoisturizing.

As shown in FIG. 7, the sectional shape in the thickness direction of each solute object has a trapezoidal shape whose upper end portion is flat as a sectional shape D4 with the diameter of the droplet before the reduced pressure drying being maintained. At this time, Marangoni convection occurs because of a difference in surface tension between the central portion containing more water and the periphery containing more EG, and balanced with a flow to the outer side accompanied with drying. For that reason, a flow near the surface of the substrate 2 stops occurring, and the sectional shape becomes flat. Additionally, since the surfactant is dissolved into the droplet object so that the surface tension of the droplet object decreases, the solute is deposited uniformly when the droplet object is re-dried without gathering at the central portion of the droplet object. Therefore, the sectional shape becomes flat. Note that, when the surfactant remains in the solute object and causes a problem, baking treatment (for example, baking treatment at approximately 400 to 500° C.) is performed on each solute object on the substrate 2 to pyrolyze the surfactant.

Subsequently, the controller 25 controls the conveyor 8, so that the coated article 2*a* is extracted from the substrate holding table 42 that stands by at the passing position, and conveyed to the coated article-accommodating part 7. Thus, the substrate 2 is placed within the accommodation shelf 7*a* of the coated article-accommodating part 7 (Step S7).

Finally, the controller 25 determines whether coating of the substrate 2 of a predetermined number is completed (Step S8). Here, the number of the coated articles 2*a* is counted, and it is determined whether the counted value reaches the predetermined value. When it is determined that coating of the substrates 2 of the predetermined number is completed (YES at Step S8), the controller 25 completes the process. On the other hand, when it is determined that coating of the substrates 2 of the predetermined number is not completed (NO at Step S8), the process is returned to Step S1, and the above-mentioned process is repeated.

As described above, according to the first embodiment of the present invention, the remoisturizing-drying module 6 is provided in which a plurality of residues that remain on the substrate 2 are dissolved, a plurality of droplet objects each containing the residue are formed, and each of the formed droplet objects is dried. Thereby, each residue on the substrate 2 is dissolved and dried under uniform conditions, and each solute object (coating film) remains on the substrate 2. Accordingly, the droplets that land on any place on the substrate are dried in a uniform phenomenon, compared with the conventional techniques in which a progress from landing to drying completion varies depending on where droplets land. Thereby, the sectional shape in the thickness direction of the solute object can be made substantially identical to each other within the coated surface, variation in the sectional shape can be suppressed, and the state of each solute object can be made uniform within the coated surface. As a result, generation of defective manufacturing of the coated article 2*a* attributed to variation in the sectional shape in the thickness direction of each solute object can be prevented.

In this manner, the fluidity of the individual residue is temporarily regained and immediately dried. Since the drying gas is flowed to forcibly move a circumferential atmosphere in the drying process, interference with vaporization of the solvent of circumferential droplets is reduced, and the state of each droplet is brought closer to the same state where only one droplet is dried. A uniform surface can be obtained by this local shape resetting and generation of drying phenomenon all over the substrate.

Moreover, in the coating process, by ejecting the solution, containing the surfactant that remains on the substrate 2 as a part of the residue, in the form of droplets, the surfactant also dissolves simultaneously at the time of redissolution of the residue, and the surface tension of the droplet object decreases. Therefore, the solute is deposited uniformly without gathering to the central portion when the droplet object is re-dried. Thereby, a flat solute object (for example, thin film) can be formed. Particularly, even when water is used as the solvent and the surface tension of the droplet object is large, a flat solute object can be formed.

Moreover, the remoisturizing-drying module 6 includes: the dissolution-blower 6b which blows a dissolution gas for dissolving the residue to each residue on the substrate 2; and the dry-blower 6c which blows a drying gas for drying the droplet object to each droplet object on the substrate 2. Accordingly, variation in the sectional shape in the thickness direction of each solute object can be surely suppressed with a simple configuration. Furthermore, by changing the concentration, the volume, etc. of the dissolution gas and those of the drying gas, it is possible to adjust the sectional shape in the thickness direction of each solute object. Accordingly, variation in the sectional shape in the thickness direction of each solute object can be surely suppressed.

Particularly, the dissolution-blower 6b is formed so that the volume of the dissolution gas (for example, the flow rate distribution of the dissolution gas in a direction perpendicular to the moving direction of the substrate 2 within the level surface) is changeable. Moreover, the dry-blower 6c is formed so that the volume of the drying gas (for example, the flow rate distribution of the drying gas in a direction perpendicular to the moving direction of the substrate 2 within the level surface) is changeable. Accordingly, by changing the volume of the dissolution gas and the volume of the drying gas, it is possible to adjust the sectional shape in the thickness direction of each solute object, and variation in the sectional shape in the thickness direction of each solute object can be surely suppressed.

Moreover, the dissolution-blower 6b includes: the dissolution-blowing head 43 which blows the dissolution gas; the dissolution gas-supplier 45 which supplies the dissolution gas to the dissolution-blowing head 43; and the dissolution gas-supplying pipe 46 which connects the dissolution-blowing head 43 to the dissolution gas-supplier 45, and through which the dissolution gas passes. The dry-blower 6c includes the dry-blowing head 47 which blows the drying gas; the drying gas-supplier 49 which supplies the drying gas to the dry-blowing head 47; and the drying gas-supplying pipe 50 which connects the dry-blowing head 47 to the drying gas-supplier 49, and through which the drying gas passes. Accordingly, variation in the sectional shape in the thickness direction of each solute object can be suppressed with a simple configuration. Furthermore, by providing the substrate moving mechanism 6a which relatively moves the dissolution-blowing head 43, the dry-blowing head 47 and the substrate 2, it is also possible to miniaturize the dissolution-blower 6b and the dry-blower 6c. Accordingly, enlargement of the entire apparatus can be prevented.

Moreover, the dissolution gas-supplying pipe 46 has the heater N provided on the outer circumferential surface thereof. When a large difference between the temperature of the dissolution gas and the temperature within the remoisturizing-drying module 6 occurs, calculation of the concentration of the solvent included in the dissolution gas becomes difficult. For that reason, the heater N performs control to adjust the temperature of the dissolution gas so that the temperature of the dissolution gas may be properly adjusted by a temperature sensor provided within the remoisturizing-drying module 6 and by a temperature sensor provided within the dissolution gas-supplying pipe 46. Note that, by controlling the temperature of the dissolution gas-supplying pipe 46, it is also possible to prevent the temperature thereof from decreasing when the dissolution gas passes through the dissolution gas-supplying pipe 46, and generation of dew condensation and the like can also be suppressed.

Moreover, the remoisturizing-drying module 6 includes the exhaust part 6d which exhausts excessive dissolution gas which does not contribute to formation of each droplet object in the dissolution gas blown by the dissolution-blower 6b. Accordingly, diffusion of a high humidity atmosphere can be prevented, it becomes difficult for the high humidity atmosphere to influence a coating film at a portion having subjected to drying, and variation in the sectional shape in the thickness direction of each solute object can be surely suppressed.

Moreover, the exhaust part 6d includes: the suction head 51 which sucks the gas between the dissolution-blowing head 43 and the dry-blowing head 47; the suction part 53 which supplies a suction force to the suction head 51; and the exhaust pipe 54 which connects the suction head 51 to the suction part 53, and through which the sucked gas passes. Accordingly, the gas between the dissolution-blowing head 43 and the dry-blowing head 47 is sucked, and increase of the humidity therebetween is suppressed. Thus, variation in the sectional shape in the thickness direction of each solute object can be surely suppressed with a simple configuration.

Moreover, since the dissolution-blowing head 43 is provided so that the relative position with respect to the substrate 2 is changeable, the relative position of the dissolution-blowing head 43 with respect to the substrate 2 can be changed so that the sectional shape in the thickness direction of each solute object can be easily adjusted. Particularly, since the dissolution-blowing head 43 is provided so that the blowing angle $\theta 1$ at which the dissolution gas is blown to the substrate 2 can be changed, the sectional shape in the thickness direction of each solute object can be easily adjusted by changing the blowing angle $\theta 1$. Moreover, since the dissolution-blowing head 43 is provided so that the spacing distance H1 to the substrate 2 can be changed, the sectional shape in the thickness direction of each solute object can be easily adjusted by changing the spacing distance H1.

In addition, since the dry-blowing head 47 is provided so that the relative position with respect to the substrate 2 is changeable, the sectional shape in the thickness direction of each solute object can be easily adjusted by changing the relative position of the dry-blowing head 47 with respect to the substrate 2. Particularly, since the dry-blowing head 47 is provided so that the blowing angle $\theta 2$ at which the drying gas is blown to the substrate 2 can be changed, the sectional shape in the thickness direction of each solute object can be easily adjusted by changing the blowing angle $\theta 2$. Moreover, since the dry-blowing head 47 is provided so that the spacing distance H2 to the substrate 2 can be changed, the sectional shape in the thickness direction of each solute object can be easily adjusted by changing the spacing distance H2.

Furthermore, particles that do not dissolve in a liquid that composes the ink can be used similarly as a solute within the ink, and those particles are also considered as a solute in a broad sense. Therefore, the ink includes a colloid, as well.

(Second Embodiment)

A second embodiment of the present invention will be described with reference to FIG. 8 to FIG. 11.

The second embodiment of the present invention is a modification of the first embodiment. Therefore, description will be given particularly on a part different from that in the first embodiment, i.e., a remoisturizing-drying module 6. Note that, in the second embodiment, description of the same parts as those described in the first embodiment will be omitted.

Figure 8:
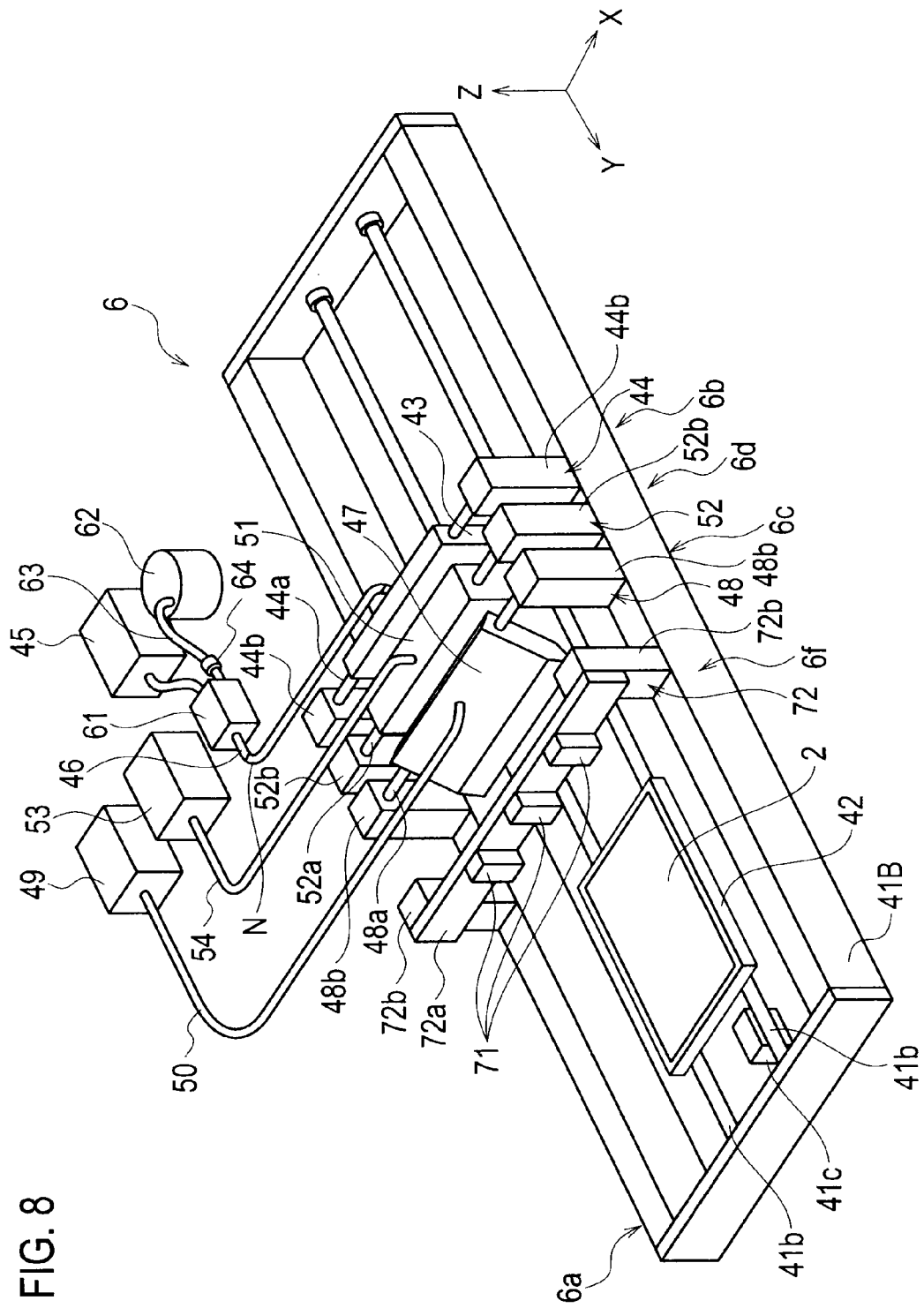
FIG. 8 is a perspective view schematically showing a configuration of a remoisturizing-drying module that a coater according to a second embodiment of the present invention includes.
Figure 9:
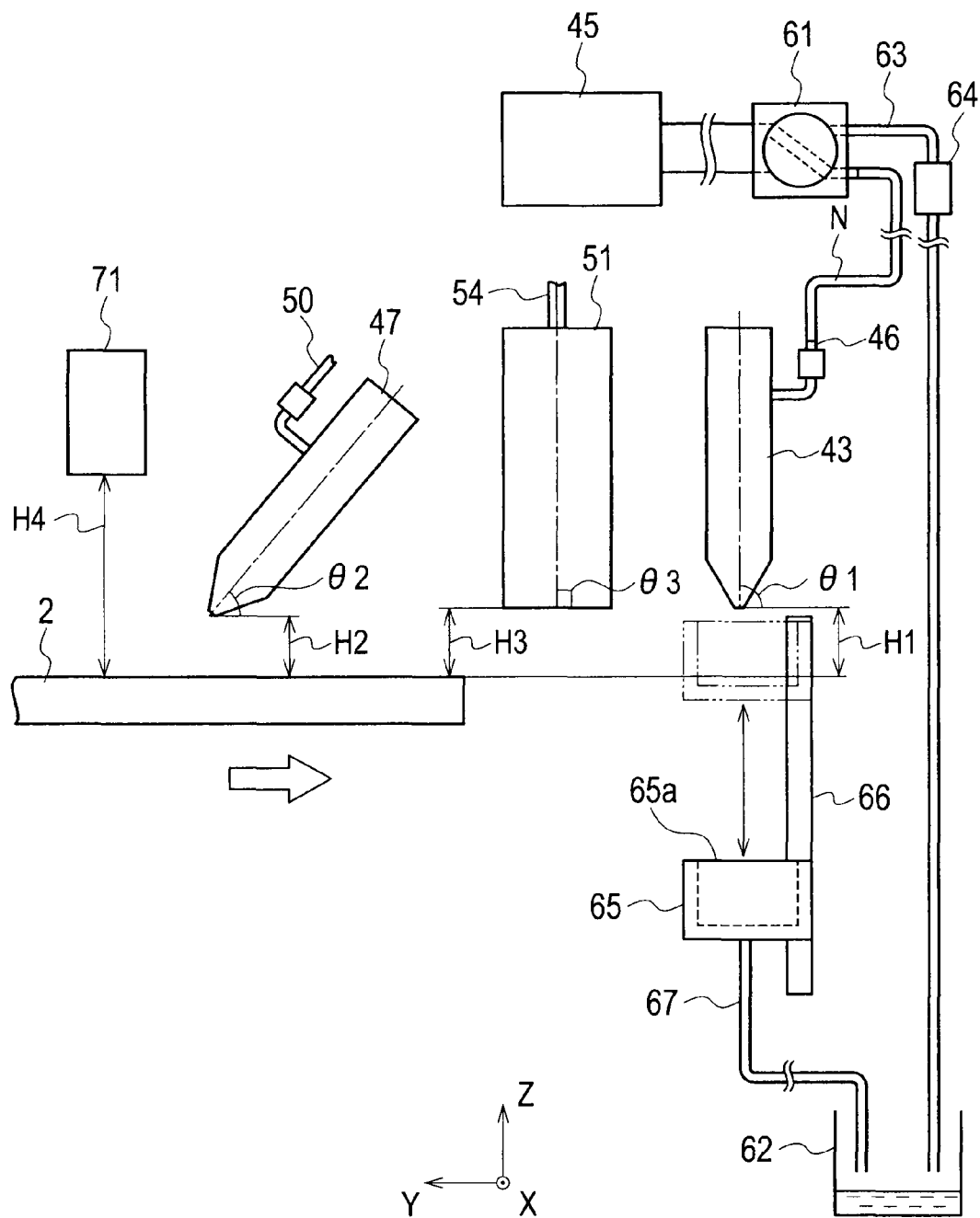
FIG. 9 is a side view schematically showing a configuration of a portion of the remoisturizing-drying module shown in FIG. 8.

As shown in FIG. 8 and FIG. 9, the remoisturizing-drying module 6 includes the substrate moving mechanism 6a, the dissolution-blower 6b, the dry-blower 6c, and the exhaust part 6d, as well as a detector 6f which detects a spacing distance (first spacing distance) H4 to the surface (coated surface) of the substrate 2 moved by the substrate moving mechanism 6a.

The substrate moving mechanism 6a is formed by stacking a Y-axis-direction guide plate 41B and a substrate holding table 42. This substrate moving mechanism 6a functions as a moving mechanism for relative movement of the substrate 2 with respect to the dissolution-blower 6b, the dry-blower 6c, the exhaust part 6d, and the detector 6f.

The Y-axis-direction guide plate 41B is provided to be fixed on the upper surface of the mount 6e. A feed mechanism in which a feed screw 41b and a driving motor 41c are used is provided within this Y-axis-direction guide plate 41B. This feed mechanism moves the substrate holding table 42 in the Y axis direction.

The substrate holding table 42 is provided movably in the Y axis direction at an upper surface side of the Y-axis-direction guide plate 41B. This substrate holding table 42 is moved in the Y axis direction by the feed mechanism in which the feed screw 41b and the driving motor 41c are used. The substrate holding table 42 includes a plurality of supporting pins (lift-up pins) which support the substrate 2, and which may project and retract. The substrate 2 is supported by those supporting pins, and conveyed as it is. Such a substrate holding table 42 reciprocally moves in the Y axis direction. Note that, in the second embodiment, the mounting position where the substrate 2 subjected to reduced pressure drying is placed, and the passing position where the coated article 2a, i.e., the redissolved and re-dried substrate 2, is passed are located at the same position. The moving speed of the substrate holding table 42 is, for example, approximately several tens mm/s.

Reasons that the process is performed with the substrate 2 being supported by the supporting pins are as follows. When the substrate holding table 42 adsorbs the substrate 2, a hole which is formed so that a lift pin for attachment and detachment of the substrate 2 can be inserted therethrough is provided on the mounting surface of the substrate holding table 42. However, a difference in heat dissipation conditions due to this hole influences the shape of a coating film, and is reflected in the element resistance. When the substrate holding table 42 is a metal, the substrate holding table 42 has good thermal conductivity, and there is a tendency to cause a difference in temperature distribution of the substrate 2 when the region of the substrate 2 becomes larger. Meanwhile, where there is a difference between the flatness of the substrate 2 and the flatness of the substrate holding table 42, the substrate 2 and the substrate holding table 42 may come into contact with each other in one place, but may not come into contact in the other place. In order to prevent these problems, it is necessary to provide a configuration in which the substrate 2 is held by the supporting pins and the process is performed in the state.

The dissolution-blower 6b includes the dissolution-blowing head 43, the supporter 44, the dissolution gas-supplier 45, and the dissolution gas-supplying pipe 46 as well as a path switching part 61 provided in the course of a path of the dissolution gas-supplying pipe 46; a tank 62 which accommodates the dissolution gas as a liquid; an exhaust pipe 63 which communicates the path switching part 61 and the tank 62 with each other; and a load adjustment valve 64 provided in the course of a path of the exhaust pipe 63. The dissolution-blower 6b further includes: a gas receiver 65 which receives a dissolution gas blown from the dissolution-blowing head 43; a receiver moving mechanism 66 which moves the gas receiver 65 in a Z axis direction that is an approaching and spacing direction with respect to the dissolution-blowing head 43; and an exhaust pipe 67 which communicates the gas receiver 65 and the tank 62 with each other (see FIG. 9).

In response to control of the controller 25, the path switching part 61 switches between a first path, through which the dissolution gas-supplier 45 is in communication with the dissolution gas-supplying pipe 46, and a second path, through which the dissolution gas-supplier 45 is in communication with the exhaust pipe 63. For example, when dissolution and drying are performed, the dissolution gas-supplier 45 is connected to the dissolution gas-supplying pipe 46, and the first path is selected. When detection is performed by the detector 6f, the dissolution gas-supplier 45 is connected to the exhaust pipe 63, and the second path is selected. Thereby, upon detection, the dissolution-blower 6b can be prevented from moisturizing the substrate 2 passing under the dissolution-blower 6b.

The tank 62 is an accommodating part which accommodates the dissolution gas that flows from the exhaust pipe 63 and the exhaust pipe 67, as a liquid. The exhaust pipe 63 is a passage which connects the path switching part 61 to the tank 62. Particularly, when the dissolution gas is not supplied to the dissolution-blowing head 43, the exhaust pipe 63 is a passage for discharging the dissolution gas to the tank 62. As this exhaust pipe 63, for example, a tube, a pipe, etc. are used.

In response to control of the controller 25, the load adjustment valve 64 adjusts the flow rate of the dissolution gas that passes through the exhaust pipe 63. At this time, the resistance value (flow rate) of the load adjustment valve 64 is adjusted to be equal to the resistance value (flow rate) of the dissolution-blowing head 43. Thereby, the resistance to the dissolution gas-supplier 45 does not change even when the path is switched. Therefore, it is possible to suppress the change in temperature and humidity of the dissolution gas-supplier 45 caused by switching the path. Note that the dissolution gas-supplier 45 adjusts the temperature and humidity of the dissolution gas to be supplied in a range of, for example, 47.5±0.5° C. and in a range of 85%±1%, and supplies the adjusted dissolution gas.

The gas receiver 65 is formed, for example, into a box form having an opening 65a. This gas receiver 65 is located at a position where the opening 65a faces the dissolution-blowing head 43, and is provided within the substrate moving mechanism 6a. The gas receiver 65 is also provided movably in the Z axis direction that is the approaching and spacing direction with respect to the dissolution-blowing head 43, and is moved by the receiver moving mechanism 66.

The receiver moving mechanism 66 is located at a position not to obstruct movement of the substrate 2 and the substrate holding table 42, and is provided within the substrate moving mechanism 6a. In response to control by the controller 25, this receiver moving mechanism 66 moves the gas receiver 65 to a retreating position where movement of the substrate 2 and the substrate holding table 42 is not obstructed when the substrate 2 and the substrate holding table 42 move in the Y axis direction. When the substrate 2 and the substrate holding table 42 do not move, the receiver moving mechanism 66 moves the gas receiver 65 to a gas receiving position where the gas receiver 65 approaches to receive the dissolution gas. In other words, the receiver moving mechanism 66 functions as a mechanism which moves the gas receiving member 65 in the blowing direction of the dissolution gas so that the gas receiver 65 may be approached to and spaced from the dissolution-blowing head 43.

The exhaust pipe 67 is a passage which connects the gas receiver 65 to the tank 62. Particularly, when dissolution and drying of the substrate 2 are not performed on the substrate 2, the exhaust pipe 67 is a passage for discharging the dissolution gas blown by the dissolution-blowing head 43 from the gas receiver 65 to the tank 62. As this exhaust pipe 67, for example, a tube, a pipe, etc. are used. Here, in order to finely control the pressure of exhaust, several exhaust pipes 67 are disposed side by side in a longitudinal direction of the gas receiver 65. A valve for flow adjustment is connected to each of the exhaust pipes 67. Thereby, adjustment of air velocity distribution is allowed.

The dissolution gas-supplier 45 of such a dissolution-blower 6b is operated constantly. Once the dissolution gas-supplier 45 stops, it may take a long time of approximately several tens minutes to stabilize the temperature, humidity, etc. of the dissolution gas (moisturized atmosphere) again. Therefore, dissolution gas-supplier 45 is operated constantly to eliminate the standby time. When the substrate 2 and the substrate holding table 42 do not move with the dissolution gas-supplier 45 operating, the gas receiver 65 exists at the gas receiving position. The gas receiver 65 receives the dissolution gas blown by the dissolution-blowing head 43 through the opening 65a. Then, the dissolution gas is sucked through the exhaust pipe 67, liquefied, and decomposed into air and the solvent. The solvent is discharged as the liquid to the tank 62. Thereby, diffusion of the dissolution gas (moisturized atmosphere) to the entire coating-drying system is prevented.

The detector 6f includes: a plurality of distance sensors 71 each of which detects the spacing distance (first spacing distance) H4 from an installed position thereof to the surface (coated surface) of the substrate 2 moving in the Y axis direction; and a supporter 72 which supports those distance sensors 71 facing the substrate moving mechanism 6a.

For example, three distance sensors 71 are provided. These distance sensors 71 detect the spacing distance H4 in an outer periphery region R2 excluding a picture element region R1 on the surface of the substrate 2 (see FIG. 10). For example, two of the distance sensors 71 respectively measure the spacing distances H4 in a pair of regions in the outer periphery region R2, the pair of regions sandwiching the picture element region R1 and extending in the Y axis direction. The remaining one distance sensor 71 measures the spacing distance H4 in a pair of regions in the outer periphery region R2, the pair of regions sandwiching the picture element region R1 and extending in the X axis direction. Note that, as the distance sensor 71, for example, a reflective sensor, an ultrasonic sensor, etc. are used.

Here, wiring, elements, residues, etc. exist in the picture element region R1. For this reason, when the spacing distance H4 is measured in the picture element region R1, accurate measurement of the spacing distance H4 is difficult. Therefore, the spacing distance H4 can be accurately measured by measuring the spacing distance H4 in the outer periphery region R2 excluding the picture element region R1 on the surface of the substrate 2.

Figure 10:
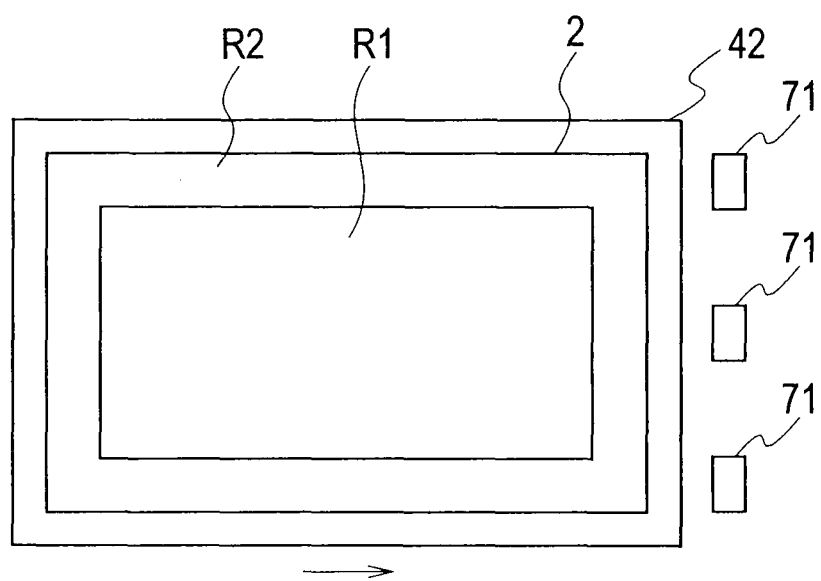
FIG. 10 is an explanatory drawing for describing a detection position on a substrate detected by a detector that the remoisturizing-drying module shown in FIG. 8 includes.

In response to control of the controller 25, this distance sensor 71 continuously measures the spacing distance H4 to the surface of the moving substrate 2, and detects the waviness (straight waviness) of the surface of the substrate 2 (see FIG. 10). Here, the waviness of the substrate surface is caused by the thickness difference within the substrate 2, the warping of the substrate 2, the flatness of the substrate holding table 42, etc. For example, the spacing distance H4 fluctuates by approximately 0.4 mm in the surface of the substrate 2, and fluctuates by approximately 0.2 mm between substrates. Note that, the resolution of the distance sensor 71 is, for example, approximately 10 μm.

The supporter 72 is formed of: a support plate 72a to which each distance sensor 71 is fixed; and a pair of columns 72b which support the support plate 72a. These columns 72b are provided on the upper surface of the substrate moving mechanism 6a. The support plate 72a supports each distance sensor 71 facing a position through which the substrate 2 passes. The support plate 72a is provided extending across the pair of columns 72b.

Here, the supporter 44 of the dissolution-blower 6b supports the dissolution-blowing head 43, and functions as a first head moving mechanism which moves the dissolution-blowing head 43 in a direction in which the spacing distance H1 (second spacing distance) to the substrate moving mechanism 6a changes (i.e., in the Z axis direction). Moreover, the supporter 48 of the dry-blower 6c supports the dry-blowing head 47, and functions as a second head moving mechanism which moves the dry-blowing head 47 in a direction in which the spacing distance H2 (third spacing distance) to the substrate moving mechanism 6a changes (i.e., in the Z axis direction).

While moving the substrate 2 in the Y axis direction by the substrate moving mechanism 6a, such a remoisturizing-drying module 6 acquires measurement data by sequentially measuring the spacing distance H4 to the coated surface of the substrate 2 with each distance sensor 71 of the detector 6f. At this time, the substrate 2 passes sequentially under the detector 6f, the dry-blower 6c, the exhaust part 6d and the dissolution-blower 6b, and stops at a standby position (position on aside opposite to the mounting position). Note that, when the spacing distance H4 is measured in the above-described manner, in order not to moisturize the substrate 2 passing under the dissolution-blower 6b, the path switching part 61 connects the dissolution gas-supplier 45 to the exhaust pipe 63, and the second path is selected. At this time, the dry-blower 6c is in the idle state.

Subsequently, the remoisturizing-drying module 6 causes the substrate moving mechanism 6a to move the substrate 2 in a direction opposite to the above-mentioned direction again. Further, while controlling movement of the dissolution-blowing head 43 of the dissolution-blower 6b and movement of the dry-blowing head 47 of the dry-blower 6c on the basis of the measurement data, the remoisturizing-drying module 6 causes the dissolution-blowing head 43 to blow the dissolution gas to the coated surface of the substrate 2. Subsequently, the dry-blowing head 47 blows the drying gas to the coated surface of the substrate 2. At this time, the substrate 2 sequentially passes under the dissolution-blower 6b, the exhaust part 6d, the dry-blower 6c and the detector 6f, and stops at the passing position (mounting position). Note that, when such dissolution and drying are performed, in order to moisturize the substrate 2 passing under the dissolution-blower 6b, the path switching part 61 connects the dissolution gas-supplier 45 to the dissolution gas-supplying pipe 46, and the first path is selected. At this time, the dry-blower 6c is in the driving state.

Next, description will be given on the droplet coating process of the above-mentioned coater 1, i.e., a manufacturing process of the coated article (product) 2a by the coater 1. The controller 25 of the coater 1 executes the droplet coating process on the basis of various kinds of programs.

Usually, the dissolution gas-supplier 45 is in the driving state constantly during manufacturing. When the substrate 2 and the substrate holding table 42 do not move at this time, the gas receiver 65 exists at the gas receiving position. The gas receiver 65 receives the dissolution gas blown from the dissolution-blowing head 43, and supplies the received gas as the liquid to the tank 62 through the exhaust pipe 67. Thereby, diffusion of the dissolution gas (moisturizing atmosphere) is prevented. Note that, the drying gas-supplier 49 is in the idle state.

Figure 11:
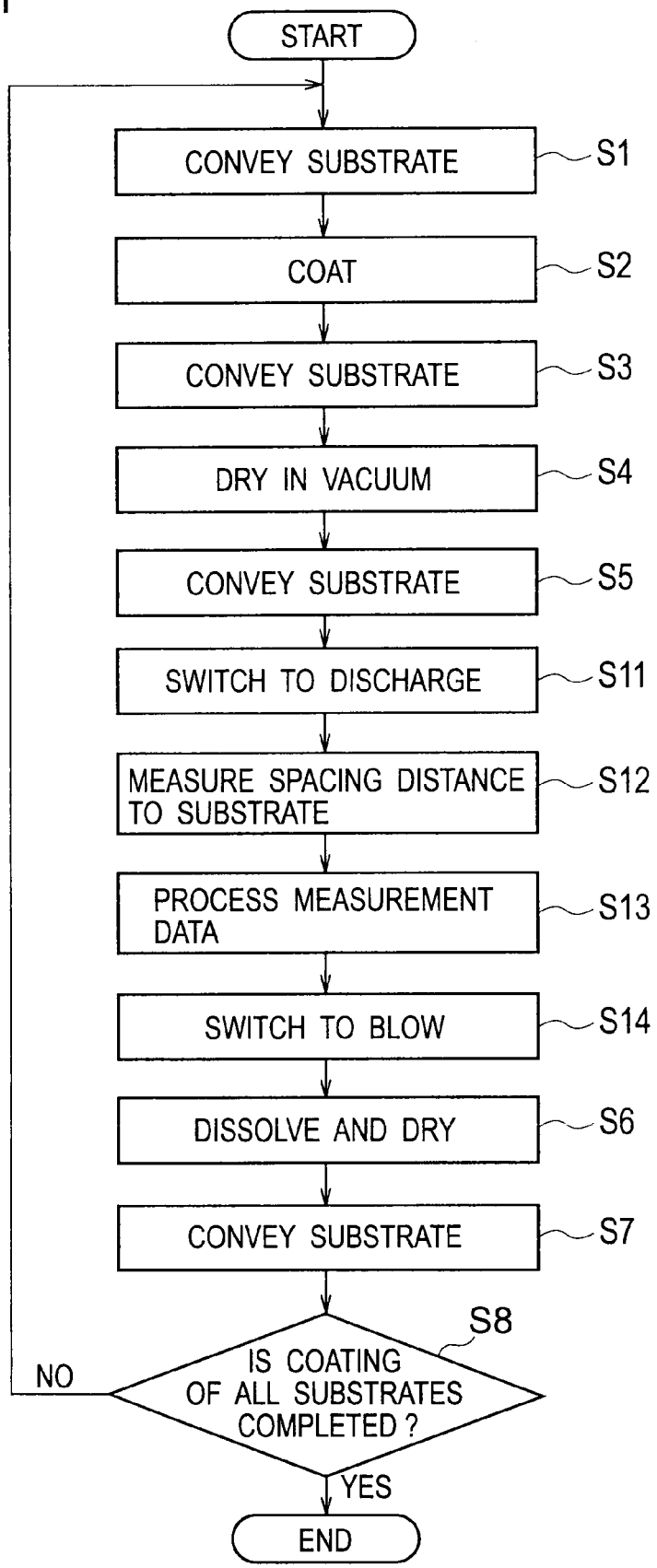
FIG. 11 is a flow chart that shows a flow of a droplet coating process of the coater shown in FIG. 8.

As shown in FIG. 11, the controller 25 performs the processes in the same manner as the first embodiment from Step S1 to Step S5. After Step S5, the controller 25 switches the path to the second path, which is a discharge path, with the path switching part 61 (Step S11). In other words, the controller 25 controls the path switching part 61 so as to switch from the first path, through which the dissolution gas-supplier 45 is in communication with the dissolution gas-supplying pipe 46, to the second path, through which the dissolution gas-supplier 45 is in communication with the exhaust pipe 63. Furthermore, the controller 25 causes the receiver moving mechanism 66 to move the gas receiver 65 to the standby position.

Subsequently, the controller 25 causes the detector 6f to measure the spacing distance H4 to the substrate 2 moving in the Y axis direction (Step S12). In other words, the controller 25 controls the detector 6f, so that the spacing distance H4 to the surface of the substrate 2 moving in the Y axis direction is continuously measured. With each distance sensor 71, the detector 6f measures the spacing distance H4 in the outer periphery region R2 excluding the picture element region R1 on the surface of the substrate 2, and detects the waviness (straight waviness) of the surface of the substrate 2. Note that, while the resolution of the distance sensor 71 is, for example, approximately 10 mm, here, this resolution may be increased to perform higher precision movement control.

Then, the controller 25 processes the measurement data, which is data on the measured spacing distance H4 (Step S13). For example, the controller 25 performs a process to average the measurement data acquired from each distance sensor 71 of the detector 6f for each measurement point in the Y axis direction, and to invert the measurement data in accordance with a conveying direction in the case of performing dissolution and drying.

Next, the controller 25 switches the path to the first path, which is a blow path, with the path switching part 61 (Step S14). In other words, the controller 25 controls the path switching part 61 so as to switch from the second path, through which the dissolution gas-supplier 45 is in communication with the exhaust pipe 63, to the first path, through which the dissolution gas-supplier 45 is in communication with the dissolution gas-supplying pipe 46. Furthermore, the controller 25 brings the drying gas-supplier 49 into the driving state. Thereby, the dissolution gas is blown from the dissolution-blowing head 43, the drying gas is blown from the dry-blowing head 47, and preparation for dissolution and drying is completed.

Subsequently, the controller 25 performs the processes in the same manner as the first embodiment from Step S6 to Step S8. Note that the conveying direction of the substrate 2 at this time is the direction opposite to that in the first embodiment. Moreover, after Step S6, the controller 25 causes the receiver moving mechanism 66 to move the gas receiver 65 to the gas receiving position. The gas receiver 65 receives the dissolution gas blown from the dissolution-blowing head 43, and supplies the received gas as the liquid to the tank 62 through the exhaust pipe 67. Thereby, diffusion of the dissolution gas (moisturizing atmosphere) is prevented.

Thus, even when the waviness exists on the surface of the substrate 2 due to thickness difference within the substrate 2, the warping of the substrate 2, the flatness of the substrate holding table 42, etc., the spacing distance H4 to the surface of the substrate 2 is detected by the detector 6f in accordance with movement of the substrate 2. On the basis of the spacing distance H4, movement of the dissolution-blowing head 43 and movement of the dry-blowing head 47 are controlled so that the spacing distance H1 between the surface of the substrate 2 and the dissolution-blowing head 43 and the spacing distance H2 between the surface of the substrate 2 and the dry-blowing head 47 may be constant. Thereby, since the dissolution-blowing head 43 and the dry-blowing head 47 move in the Z axis direction in accordance with the movement of the substrate 2 in the Y axis direction so that the spacing distance H1 and the spacing distance H2 are constant, uniform moisturizing and drying are performed all over the substrate 2. Accordingly, uniformity in the degree of unevenness of each solute object can be improved within the surface of the substrate 2.

Usually, the dissolution gas-supplier 45 is in the driving state constantly during manufacturing. Although the dissolution gas is blown from the dissolution-blowing head 43 at this time, the gas receiver 65 exists at the gas receiving position, receives the dissolution gas blown from the dissolution-blowing head 43, and supplies the received gas as the liquid to the tank 62 through the exhaust pipe 67. Thereby, diffusion of the dissolution gas (moisturizing atmosphere) can be prevented. Furthermore, when the spacing distance H4 is measured by the detector 6f, the path switching part 61 connects the dissolution gas-supplier 45 to the exhaust pipe 63, so that blowing of the dissolution gas by the dissolution-blowing head 43 is prevented, allowing the prevention of moisturization of the substrate 2 moving in Y axis direction. Accordingly, unnecessary moisturization of the substrate 2 can be prevented. Additionally, since the dissolution gas-supplier 45 can be kept driven, the standby time until the dissolution gas (moisturizing atmosphere) is stabilized is eliminated, and the productivity can be improved.

As described above, according to the second embodiment of the present invention, the same effects as those of the first embodiment can be obtained. Further, provided are: the detector 6f which detects the spacing distance H4 to the surface of the relatively moving substrate 2; the supporter 44 which is the head moving mechanism for moving the dissolution-blowing head 43 in such a direction as to change the spacing distance H1 between the dissolution-blowing head 43 and the surface of the relatively moving substrate 2; the supporter 48 which is the head moving mechanism for moving the dry-blowing head 47 in such a direction as to change the spacing distance H2 between the dry-blowing head 47 and the surface of the relatively moving substrate 2; and the controller 25 which, on the basis of the detected spacing distance H4, controls the supporter 44 so that the spacing distance H1 to the moving substrate 2 may become constant, and controls the supporter 48 so that the spacing distance H2 may become constant. Thereby, even when waviness exists on the surface of the substrate 2, the spacing distance H1 and the spacing distance H2 are constant with respect to the moving substrate 2, and uniform moisturization and drying can be performed all over the substrate 2. Thereby, uniformity in the degree of unevenness of each solute object can be improved within the surface of the object to be coated. As a result, generation of defective manufacturing of the coated article 2a attributed to variation in the sectional shape in the thickness direction of each solute object can be prevented.

Moreover, the dissolution-blower 6*b* includes: the exhaust pipe 63 for exhausting the dissolution gas supplied from the dissolution gas-supplier 45 to the dissolution-blowing head 43, the exhaust pipe 63 being connected in the course of the dissolution gas-supplying pipe 46; and the path switching part 61 which switches between the first path, through which the dissolution gas-supplier 45 is in communication with the dissolution gas-supplying pipe 46, and the second path, through which the dissolution gas-supplier 45 is in communication with the exhaust pipe 63. Accordingly, when the spacing distance H4 to the substrate 2 is measured, the dissolution gas-supplier is connected to the exhaust pipe 63, the dissolution gas-supplier 45 is kept driven without moisturizing the substrate 2. Thereby, since the substrate 2 is not moisturized, unnecessary moisturization of the substrate 2 can be prevented. Additionally, since the driving state of the dissolution gas-supplier 45 is maintained, the standby time until the dissolution gas (moisturizing atmosphere) is stabilized is no longer necessary, and the productivity can improve.

(Third Embodiment)

A third embodiment of the present invention will be described with reference to FIG. 12 and FIG. 13.

The third embodiment of the present invention is a modification of the first embodiment. Therefore, description will be given particularly on a part different from that in the first embodiment. Note that, in the third embodiment, description of the same parts as those described in the first embodiment will be omitted.

Figure 12:
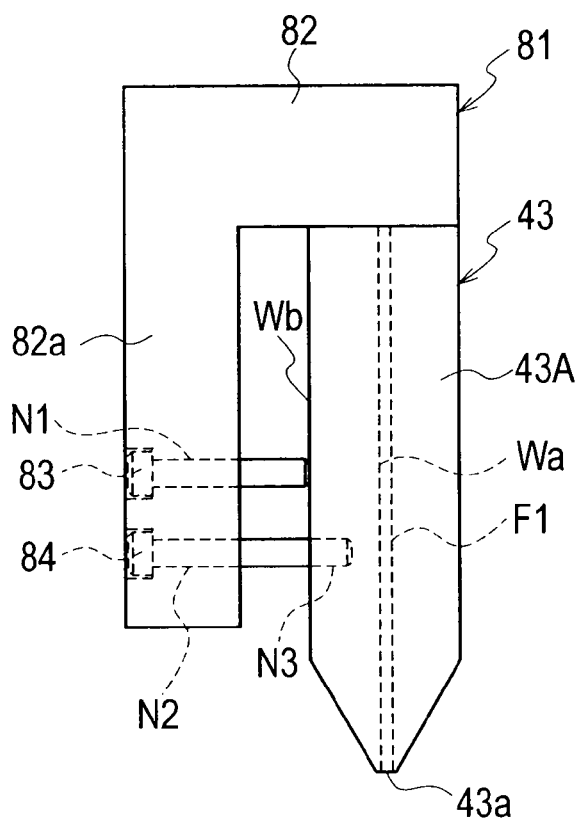
FIG. 12 is a side view showing a dissolution blowing head that a remoisturizing-drying module of a coater according to a third embodiment of the present invention includes.

As shown in FIG. 12, a slit adjuster 81 is provided to the dissolution-blowing head 43. A blowing passage F1 is provided within this dissolution-blowing head 43. The blowing passage F1 is in communication with the blowing port 43*a*, which is an opening. In other words, the dissolution-blowing head 43 includes a head base 43A having: an inner surface Wa which forms the blowing passage F1 of a slit shape; and an outer surface Wb opposing to the inner surface Wa. Note that the blowing passage F1 is in communication with the dissolution gas-supplying pipe 46. The dissolution gas flowed from the dissolution gas-supplying pipe 46 passes through the blowing passage F1, and is blown from the blowing port 43*a*.

The blowing passage F1 is formed into the shape of a long slit (elongated space) in a direction perpendicular to a direction in which the dissolution gas flows, and the blowing port 43*a* of the dissolution-blowing head 43 has a rectangular shape. In the dissolution-blowing head 43, a longitudinal direction (slit longitudinal direction) of the blowing port 43*a* is set in parallel to a direction perpendicular to the moving direction of the substrate 2 within a plane.

Here, the dissolution-blowing head 43 is also enlarged along with enlargement of the substrate 2, and the size of the blowing port 43*a* in the longitudinal direction also increases and is approximately 1000 mm, for example. For this reason, it is difficult to form the planar shape of the blowing port 43*a* into a rectangular shape, and particularly, the width (slit distance) in the lateral direction of the blowing port 43*a* is not uniform in many cases. In such a case, it is difficult to blow the dissolution gas uniformly (evenly), and accordingly uniformity in the degree of unevenness of each solute object is reduced within the surface of the substrate 2. For this reason, the slit adjuster 81 which adjusts the width (slit distance) in the lateral direction of the blowing port 43*a* to be uniform is needed.

The slit adjuster 81 is formed of: a base member 82 provided to the head base 43A; a plurality of pressing members 83 which press the outer surface Wb (outer surface on the left side in FIG. 12) of the head base 43A in a direction in which the blowing passage F1 becomes narrow; and a plurality of pulling members 84 which pull the outer surface Wb of the head base 43A in a direction in which the blowing passage F1 becomes wide.

The base member 82 has a reference portion 82*a* which is spaced from the outer surface Wb of the head base 43A, and which extends approximately in parallel to the slit longitudinal direction. This base member 82 is formed so as to have a larger flexural strength than that of the head base 43A, and the reference portion 82*a* serves as a reference position at the time of adjusting the slit distance. Note that, as the base member 82, a member having a sectional shape formed into an L shape is used, for example.

A plurality of through holes N1 and N2 are provided in the reference portion 82*a*. These through holes N1 and N2 are respectively provided in two rows arranged in a direction perpendicular to a direction in which the dissolution gas passes through the blowing passage F1, i.e., in the slit longitudinal direction. In the outer surface Wb of the head base 43A, a plurality of holes N3 are provided facing the respective through holes N2. These holes N3 are also arranged in the slit longitudinal direction in one row. A spiral groove is formed in each through hole N1 and each through hole N2, and each through hole N1 and each through hole N2 function as a female screw. Moreover, a bearing (not shown), such as a bearing that rotatably holds the pulling member 84, is provided in the hole N3.

Each pressing member 83 is inserted into each through hole N1 of the reference portion 82*a*, arranged side by side in the slit longitudinal direction, and provided so that each pressing member 83 can press the outer surface Wb of the head base 43A. Moreover, each pulling member 84 is inserted into each through hole N3 of the reference portion 82*a* and into each hole N3 of the head base 43A, arranged side by side in the slit longitudinal direction, and provided so that each pulling member 84 can pull the outer surface Wb of the head base 43A. As each pressing member 83 and each pulling member 84, a male screw or the like is used, for example.

In such a slit adjuster 81, each pressing member 83 and each pulling member 84 are rotated by an operator, etc. to adjust a pressing force for pressing the outer surface Wb of the head base 43A and a tensile force for pulling the outer surface Wb. Thereby, the inner surface Wa of the head base 43A deforms, and the slit distance also changes. At this time, the pressing force and the tensile force are adjusted so that the planar shape of the slit-shape blowing port 43*a* may become rectangular, in other words, the passage sectional shape of the blowing passage F1 of the dissolution-blowing head 43 may become rectangular. Thereby, uniform (even) blowing of the dissolution gas by the dissolution-blowing head 43 is allowed.

Figure 13:
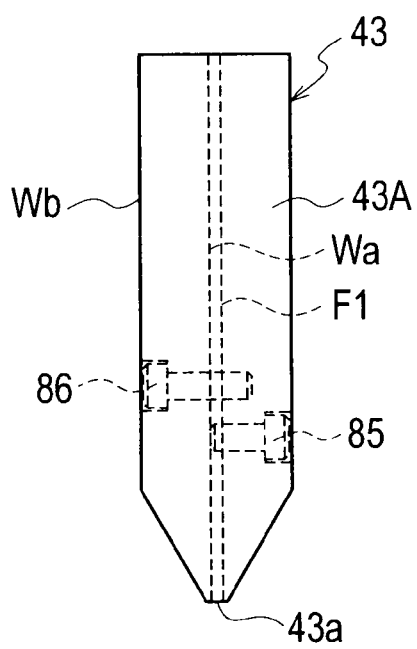
FIG. 13 is a side view showing a dissolution head of a comparative example in relation to the dissolution blowing head shown in FIG. 12.

Here, as shown in FIG. 13, a plurality of pressing members 85, which press a wall surface (inner surface Wa) constituting the blowing passage F1 in the direction in which the blowing passage F1 becomes wide, and a plurality of pulling members 86, which pulls a wall surface (inner surface Wa) constituting the blowing passage F1 in the direction in which the blowing passage F1 becomes narrow, may be provided directly in the head base 43A of the dissolution-blowing head 43. In this case, each pressing member 85 and each pulling member 86 exist within the blowing passage F1, and obstruct a flow of the dissolution gas that passes through the blowing passage F1. Particularly, since the plurality of pressing members 85 and the plurality of pulling members 86 are respectively provided as if each group of those members is in line, uniform blowing of the dissolution gas is markedly obstructed.

On the other hand, as shown in FIG. 12, when the above-mentioned slit adjuster 81 is used, each pressing member 83 and each pulling member 84 do not exist within the blowing passage F1, and do not obstruct the flow of the dissolution gas that passes through the blowing passage F1. This allows uniform blowing of the dissolution gas compared with the case where each pressing member 85 and each pulling member 86 exist within the blowing passage F1. As a result, since the whole surface of the substrate 2 is uniformly moisturized, uniformity in the degree of unevenness of each solute object can be improved within the surface of the substrate 2.

The slit distance is made variable in the above-described manner. Thereby, the gas flow rate is adjustable when observed in a direction perpendicular to a traveling direction of the substrate 2 (traveling direction of a work) within the plane. However, since each pressing member 85 and each pulling member 84 of the slit adjuster 81 are dispersedly disposed in a plurality of spots in the slit longitudinal direction, it is difficult to adjust the flow rate distribution in the slit longitudinal direction completely monotonically with repeatability. For this reason, at least one of the dissolution-blowing head 43 and the dry-blowing head 47 is provided in the slit longitudinal direction displaceably, and variation in the flow rate distribution in the slit adjuster 81 is compensated by adjusting the relative position of the dissolution-blowing head 43 and the dry-blowing head 47.

As described above, according to the third embodiment of the present invention, the same effects as those in the first embodiment can be obtained. Further, provision of the slit adjuster 81 enables adjustment of the slit distance of the blowing passage F1 of the dissolution-blowing head 43. For that reason, uniform blowing of the dissolution gas from the dissolution-blowing head 43, i.e., uniform blowing-air velocity distribution (flow rate distribution) can be achieved. Thereby, uniformity in the degree of unevenness of each solute object can be further improved within the surface of the object to be coated. As a result, generation of defective manufacturing of the coated article 2a attributed to variation in the sectional shape in the thickness direction of each solute object can be surely prevented. Note that, since the same problem may occur also in the dry-blowing head 47, the slit adjuster 81 is preferably provided to the dry-blowing head 47.

In the present embodiment, the pressing members 83 and the pulling members 84 are provided, but the present embodiment is not limited to this. Only the pressing members 83 may be provided. In this case, when the pressing force of each pressing member 83 is weakened, the slit distance of the blowing passage F1 is widened by the restoring force of the head base 43A of the dissolution-blowing coating head 43.

(Fourth Embodiment)

A fourth embodiment of the present invention will be described with reference to FIG. 14.

The fourth embodiment of the present invention is a modification of the first embodiment. Therefore, description will be given particularly on parts different from those in the first embodiment. Note that, in the fourth embodiment, description of the same parts as those described in the first embodiment will be omitted.

Figure 14:
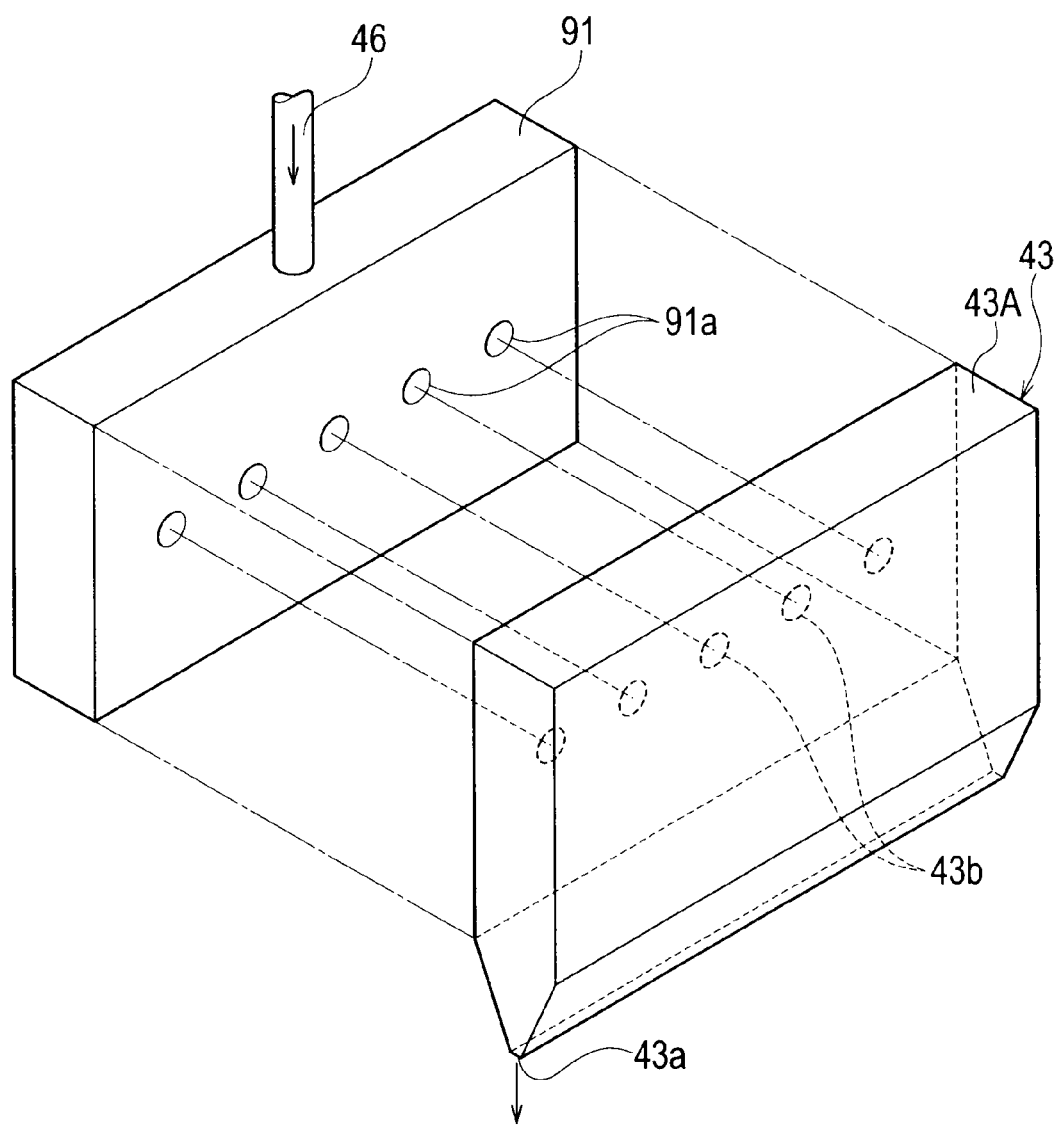
FIG. 14 is an exploded perspective view showing a dissolution blowing head that a remoisturizing-drying module of a coater according to a fourth embodiment of the present invention includes.

As shown in FIG. 14, a buffer box 91 is provided to the dissolution-blowing head 43. This buffer box 91 is a box for making a dissolution gas uniformly flow into the dissolution-blowing head 43, and functions as a buffer part. Thereby, uniform blowing of the dissolution gas from the dissolution-blowing head 43 is achieved.

The dissolution-blowing head 43 has the blowing port 43a of a rectangular shape as well as a plurality of openings 43b for communication. These openings 43b are provided on a straight line parallel to the longitudinal direction of the blowing port 43a. The buffer box 91 also has a plurality of openings 91a for communication. These openings 91a are provided respectively corresponding to the openings 43b of the dissolution-blowing head 43. The dissolution gas-supplying pipe 46 is connected to the upper surface of the buffer box 91 (in FIG. 14). The dissolution gas supplied from this dissolution gas-supplying pipe 46 flows into and diffuses in the buffer box 91. Then, the dissolution gas flows into the dissolution-blowing head 43 through each opening 91a and each opening 43b, and is blown from the blowing port 43a of the dissolution-blowing head 43. Since this enables uniform blowing of the dissolution gas and the whole surface of the substrate 2 is uniformly moisturized, uniformity in the degree of unevenness of each solute object can be improved within the surface of the substrate 2.

As described above, according to the fourth embodiment of the present invention, the same effects as those in the first embodiment can be obtained. Further, provision of the buffer box 91 enables uniform flow of the dissolution gas into the dissolution-blowing head 43. For that reason, uniform blowing of the dissolution gas from the dissolution-blowing head 43, i.e., uniform blowing-air velocity distribution can be achieved. Thereby, uniformity in the degree of unevenness of each solute object can be further improved within the surface of the object to be coated. As a result, generation of defective manufacturing of the coated article 2a attributed to variation in the sectional shape in the thickness direction of each solute object can be surely prevented. Note that, since the same problem may occur also in the dry-blowing head 47, the buffer box 91 is preferably provided to the dry-blowing head 47.

(Fifth Embodiment)

A fifth embodiment of the present invention will be described with reference to FIG. 15 and FIG. 16.

The fifth embodiment of the present invention is a modification of the first embodiment. Therefore, description will be given particularly on parts different from those in the first embodiment. Note that, in the fifth embodiment, description of the same parts as those described in the first embodiment will be omitted.

Figure 15:
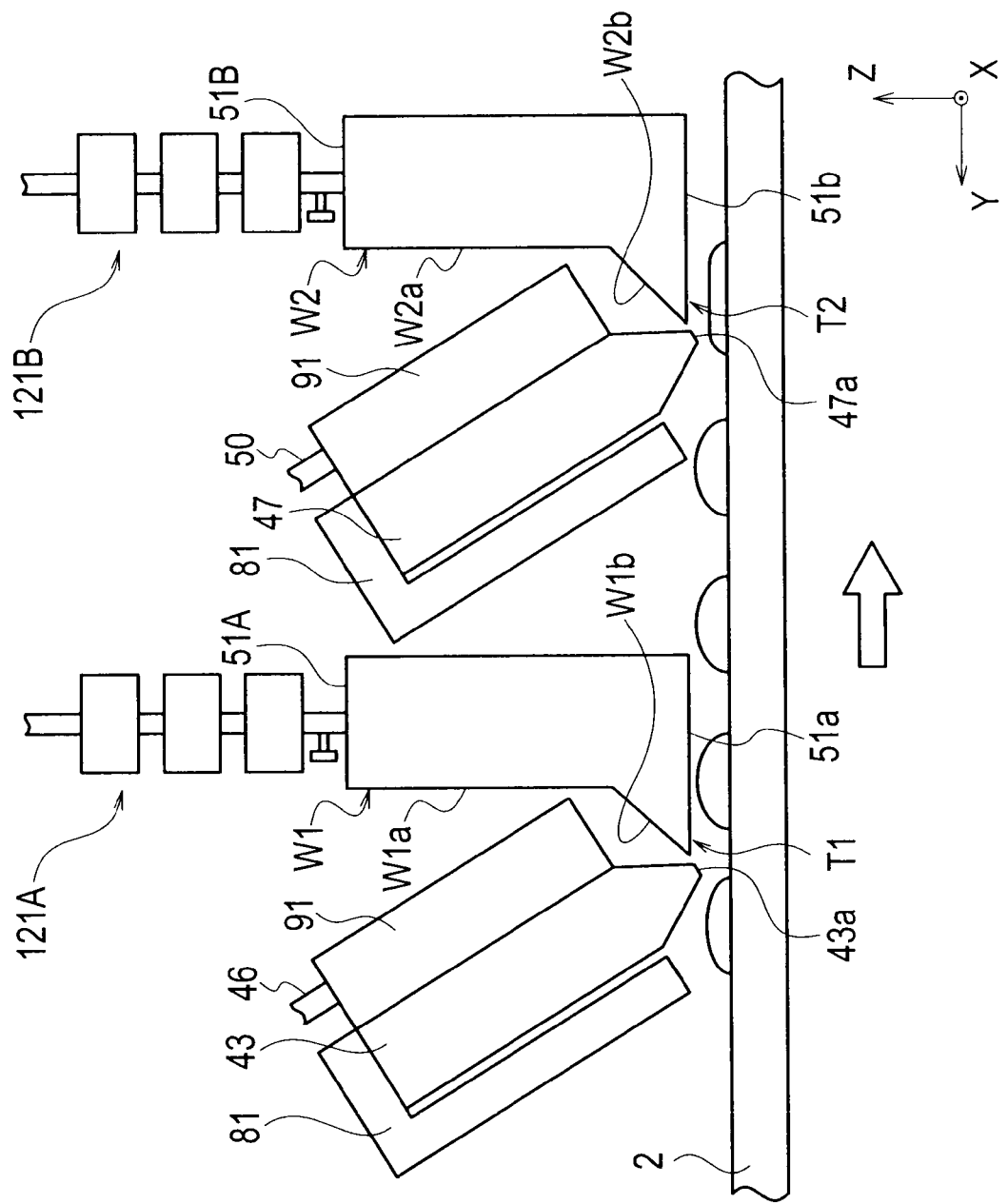
FIG. 15 is a side view schematically showing a configuration of a portion of a remoisturizing-drying module of a coater according to a fifth embodiment of the present invention.

As shown in FIG. 15, a suction head 51A is provided downstream in the conveying direction of the substrate 2, corresponding to the dissolution-blowing head 43. Moreover, a suction head 51B is provided downstream in the conveying direction of the substrate 2, corresponding to the dry-blowing head 47. Further, a suction-air velocity distribution adjuster 121A for adjusting suction-air velocity distribution at the time of sucking (exhaust-air velocity distribution) is provided to the suction head 51A. Similarly, a suction-air velocity distribution adjuster 121B is provided to the suction head 51B.

Here, the dissolution-blowing head 43 and the dry-blowing head 47 are provided inclining to the surface of the substrate 2. Note that the blowing angle $\theta 1$ at which the dissolution gas is blown to the substrate 2 is approximately 45°, for example, and the blowing angle $\theta 2$ at which the drying gas is blown to the substrate 2 is also approximately 45°, for example. Moreover, the dissolution-blowing head 43 and the dry-blowing head 47 are provided with, for example, the slit adjuster 81 according to the third embodiment and the buffer box 91 according to the fourth embodiment (note that description of the same parts as those described in the third and fourth embodiments will be omitted).

For restrictions related to the buffer box 91 provided to the dissolution-blowing head 43, the suction head 51A is provided so as to be spaced by a predetermined distance from the dissolution-blowing head 43. Therefore, in order to surely suck the dissolution gas blown from the dissolution-blowing head 43, the suction head 51A has a projection portion T1 extending to the vicinity of the blowing port 43a of the dissolution-blowing head 43. In other words, a side wall W1 of the suction head 51A on a side of the dissolution-blowing head 43 is formed of: a side wall W1a extending in the Z axis direction; and an inclined wall W1b gradually inclined from the side wall W1a toward the blowing port 43a of the dissolution-blowing head 43. This inclined wall W1b functions as the projection portion T1. Thereby, an intake port 51a of the suction head 51A becomes adjacent to the blowing port 43a of the dissolution-blowing head 43. For that reason, the dissolution gas blown from the blowing port 43a can be surely sucked, and diffusion of the dissolution gas can be surely prevented.

For restrictions related to the buffer box 91 provided to the dry-blowing head 47, the suction head 51B is provided so as to be spaced by a predetermined distance from the dry-blowing head 47. Therefore, in order to surely suck the drying gas blown from the dry-blowing head 47, the suction head 51B has a projection portion T2 extending to the vicinity of the blowing port 47a of the dry-blowing head 47. In other words, a side wall W2 of the suction head 51B on a side of the dry-blowing head 47 is formed of: a side wall W2a extending in the Z axis direction; and an inclined wall W2b gradually inclined from the side wall W2a toward the blowing port 47a of the dry-blowing head 47. This inclined wall W2b functions as the projection portion T2. Thereby, an intake port 51b of the suction head 51B becomes adjacent to the blowing port 47a of the dry-blowing head 47. For that reason, the drying gas blown from the blowing port 47a can be surely sucked, and diffusion of the drying gas can be surely prevented.

The suction-air velocity distribution adjuster 121A is connected to the suction head 51A, and the suction-air velocity distribution adjuster 121B is connected to the suction head 51B. The suction-air velocity distribution adjuster 121A and the suction-air velocity distribution adjuster 121B have the same structure. Therefore, the suction-air velocity distribution adjuster 121A will be described as an example.

Figure 16:
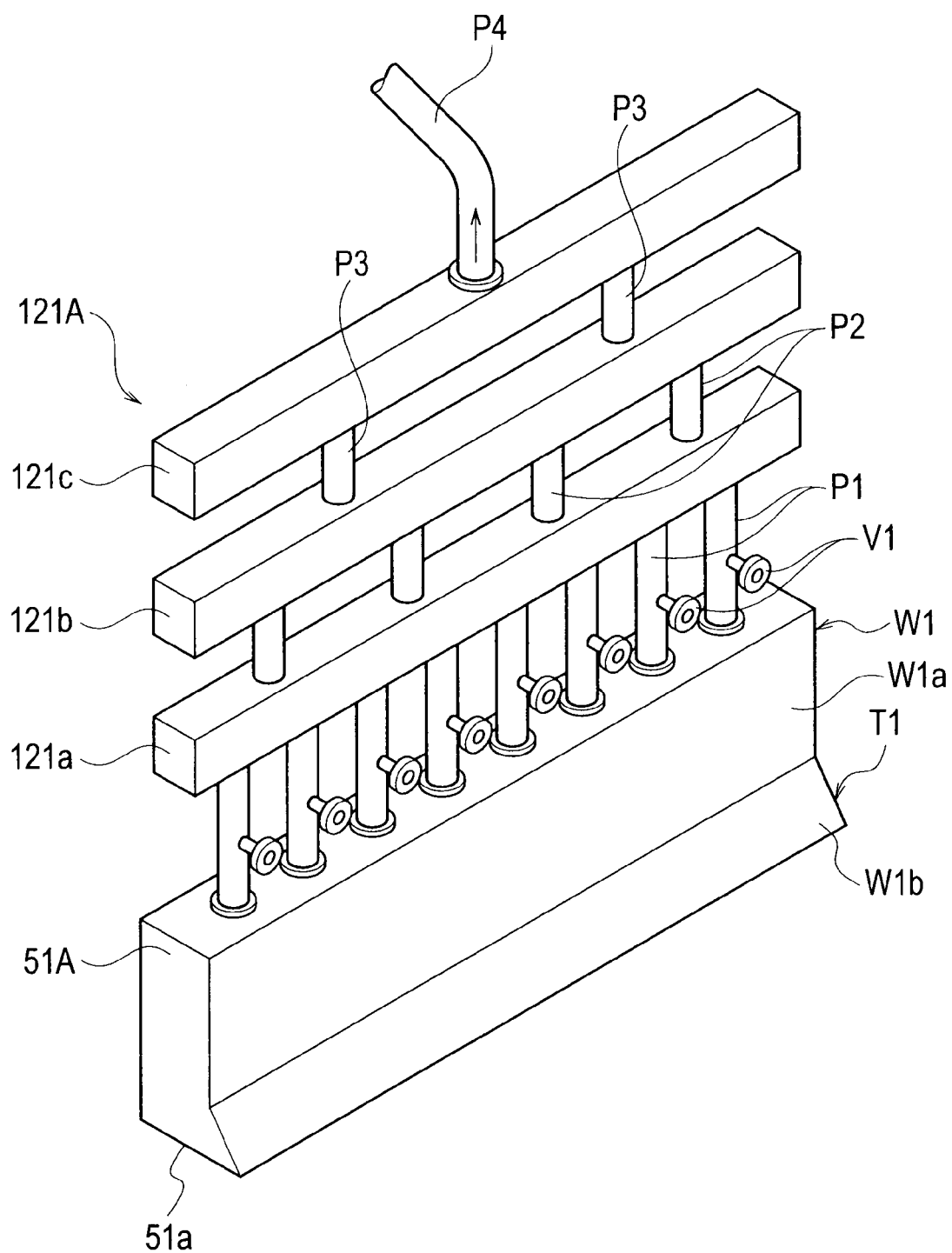
FIG. 16 is a perspective view showing a suction head and a suction wind velocity distribution controller that the remoisturizing-drying module shown in FIG. 15 includes.

As shown in FIG. 16, the suction-air velocity distribution adjuster 121A includes: three buffers 121a, 121b, and 121c having a box shape and extending in parallel to a longitudinal direction of the suction head 51A; eight pipes P1 each communicating the suction head 51A with the buffer 121a; four pipes P2 each communicating the buffer 121a with the buffer 121b; two pipes P3 each communicating the buffer 121b with the buffer 121c; one pipe P4 connected to the buffer 121c and communicating the buffer 121c with the suction part 53; and eight valves V1 respectively provided to the eight pipes P1. These valves V1 are valves which respectively adjust the flow rate of gas that passes through the corresponding pipes P1. As each valve, a needle valve is used, for example. Here, when the number of buffers is increased to increase the number of stages, it is possible to improve uniformity of suction-air velocity distribution. However, since the adjusting device itself is enlarged in that case, the number of stages is selected in consideration of the installation space and the like.

This suction-air velocity distribution adjuster 121A has a plurality of exhaust routes (gas passages) that extend from the suction head 51A to the pipe P4 serving as the exhaust pipe 54 through each of the buffers 121a, 121b and 121c and each of the pipes P1, P2 and P3. Those exhaust routes are formed to have the same length. Further, those exhaust routes are formed so that the number of the pipes connected may be reduced (for example, by half) from the suction head 51A toward the pipe P4 every time those exhaust routes pass through the buffers 121a, 121b, and 121c in this order. Thereby, uniform suction-air velocity distribution by suction can be obtained. Moreover, since each valve V1 is provided to each pipe P1, fine adjustment is allowed for uniform suction-air velocity distribution. Additionally, the nonuniform suction-air velocity distribution can also be made intentionally.

In this respect, when the suction-air velocity distribution (exhaust-air velocity distribution) is generated, variation in the sectional shape in the thickness direction of each solute object is generated within the surface of an object to be coated. In this case, the suction-air velocity distribution is adjusted to be uniform. On the other hand, even when the suction-air velocity distribution is uniform, if the blowing-air velocity distribution of the dissolution gas or that of the drying gas becomes nonuniform, variation in the sectional shape in the thickness direction of each solute object is generated within the surface of the object to be coated. In this case, in accordance with the degree of unevenness of each solute object within the surface of the object to be coated, the suction-air velocity distribution is nonuniformly adjusted so that the generation of the variation may be suppressed.

When the suction-air velocity distribution is adjusted, an adjustment person such as an operator uses, for example, a hot wire anemometer (not shown) which measures an air velocity based on temperature change of a hot wire. Specifically, the hot wire is brought close to the vicinity of the intake port 51a of the suction head 51A to measure the air velocity at each spot as the hot wire is moved in the longitudinal direction of the intake port 51a at equal pitches. Then, the adjustment person finely adjusts each valve V1 on the basis of the measured air velocity, for example, by making the suction-air velocity distribution uniform, or by adjusting each valve V1 to intentionally make the suction-air velocity distribution nonuniform in accordance with the degree of unevenness of each solute object within the surface of the object to be coated. The same adjustment is performed also in the suction head 51B.

As described above, according to the fifth embodiment of the present invention, the same effects as those in the first embodiment can be obtained. Furthermore, by providing the projection portion T1 to the suction head 51A, the intake port 51a of the suction head 51A becomes adjacent to the blowing port 43a of the dissolution-blowing head 43. For that reason, the dissolution gas blown from the blowing port 43a can be surely sucked, and diffusion of the dissolution gas can be surely prevented. Similarly, by providing the projection portion T2 to the suction head 51B, the intake port 51b of the suction head 51B becomes adjacent to the blowing port 47a of the dry-blowing head 47. For that reason, the drying gas blown from the blowing port 47a can be surely sucked, and diffusion of the drying gas can be surely prevented.

Moreover, by providing the suction-air velocity distribution adjusters 121A and 121B, the suction-air velocity distribution of the suction head 51A and that of the suction head 51B can be adjusted so that the gas can be uniformly sucked by each of the suction heads 51A and 51B. Accordingly, uniform suction of the gas by each of the suction heads 51A and 51B, i.e., uniform suction-air velocity distribution, can be achieved. Thereby, uniformity in the degree of unevenness of each solute object can be further improved within the surface of the object to be coated. As a result, generation of defective manufacturing of the coated article 2a attributed to variation in the sectional shape in the thickness direction of each solute object can be surely prevented. Additionally, suppose a case where, while the suction-air velocity distribution is uniform, the blowing-air velocity distribution of the dissolution gas or that of the drying gas is nonuniform. In this case, even when variation in the sectional shape in the thickness direction of each solute object is generated within the surface of the object to be coated, the suction-air velocity distribution of the suction head 51A and that of the suction head 51B can be adjusted in accordance with the degree of unevenness of each solute object. Accordingly, it is possible to suppress reduction of uniformity in the degree of unevenness of each solute object within the surface of the object to be coated, the reduction being attributed to the nonuniformity of the blowing-air velocity distribution of the dissolution gas or that of the drying gas.

Particularly, the exhaust part 6d includes: the suction head 51A which is a rectangular parallelepiped box-shape head, and which has a rectangular intake port 51a that sucks a blown dissolution gas; the plurality of buffers 121a, 121b, and 121c each of which is provided in parallel to the longitudinal direction of the intake port 51a, and which are arranged side by side in a direction perpendicular to both the longitudinal direction and the lateral direction of the intake port 51a; the plurality of pipes P1 which are arranged side by side in the longitudinal direction of the intake port 51a, and which connect the suction head 51A to the buffer 121a adjacent thereto; the plurality of pipes P2 which are arranged side by side in the longitudinal direction of the intake port 51a, and which connect the buffers 121a to 121b adjacent to each other; the plurality of pipes P3 which are arranged side by side in the longitudinal direction of the intake port 51a, and which connect the buffers 121b to 121c adjacent to each other; and the pipe (exhaust pipe) P4 connected to the buffer 121c located farthest from the suction head 51A. Each of the pipes P1, P2, and P3 is disposed so that the plurality of exhaust routes each extending from the suction head 51A to the pipe P4 may have the same length, and that the number of the pipes connected may be reduced (for example, by half) from the suction head 51A toward the pipe P4 every time those exhaust routes pass through the buffers 121a, 121b, and 121c in this order. Thereby, uniform suction of the gas by the suction head 51A, i.e., uniform suction-air velocity distribution can be achieved. Note that, also in the suction head 51B having the same configuration, uniform suction of the gas by the suction head 51A, i.e., uniform suction-air velocity distribution, is achieved.

(Sixth Embodiment)

A sixth embodiment of the present invention will be described with reference to FIG. 17 to FIG. 19.

The sixth embodiment of the present invention is a modification of the first embodiment. Therefore, description will be given particularly on parts different from those in the first embodiment. Note that, in the sixth embodiment, description of the same parts as those described in the first embodiment will be omitted.

Figure 17:
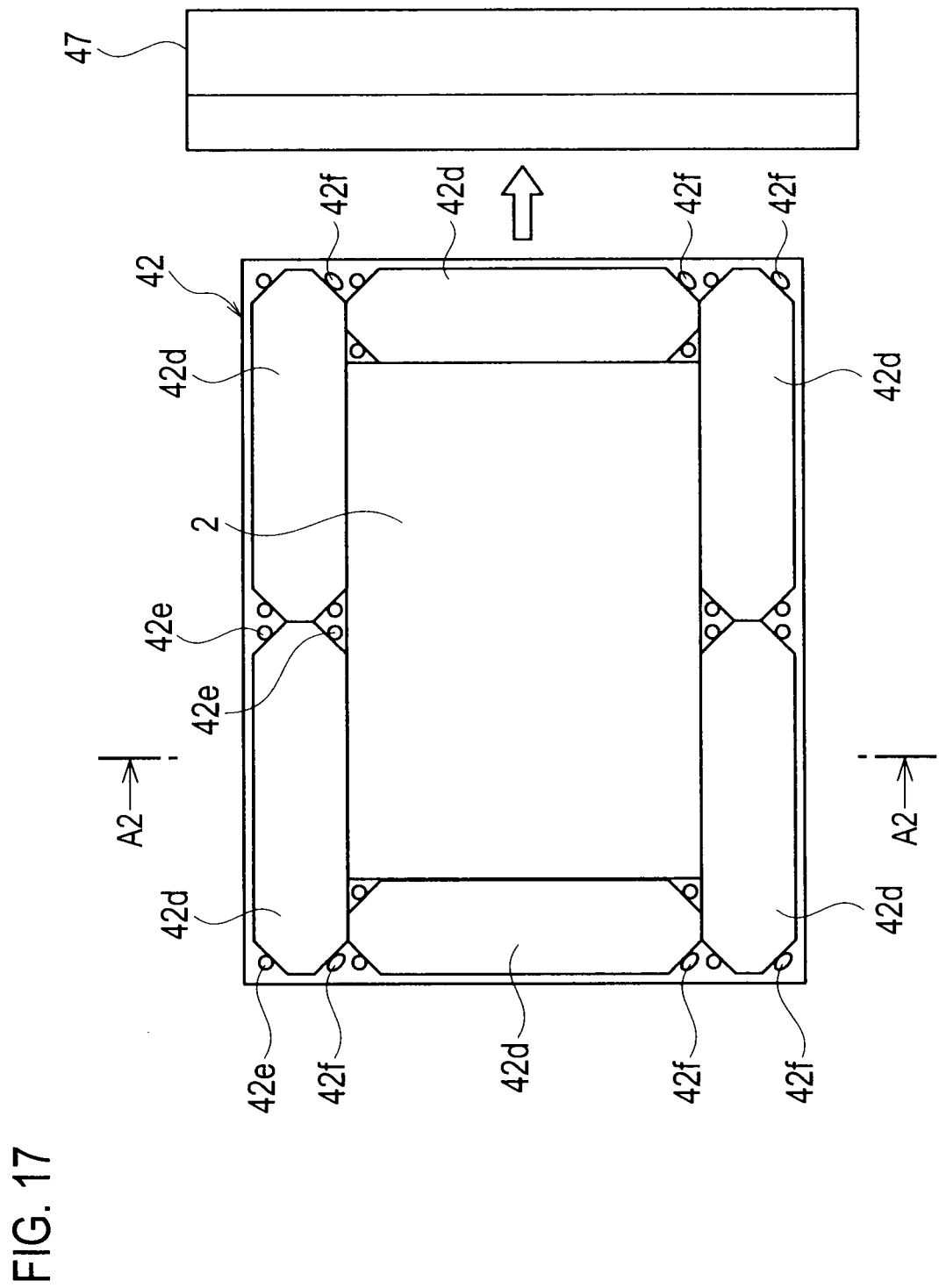
FIG. 17 is a plan view showing a substrate holding table that a remoisturizing-drying module of a coater according to a sixth embodiment of the present invention includes.
Figure 18:
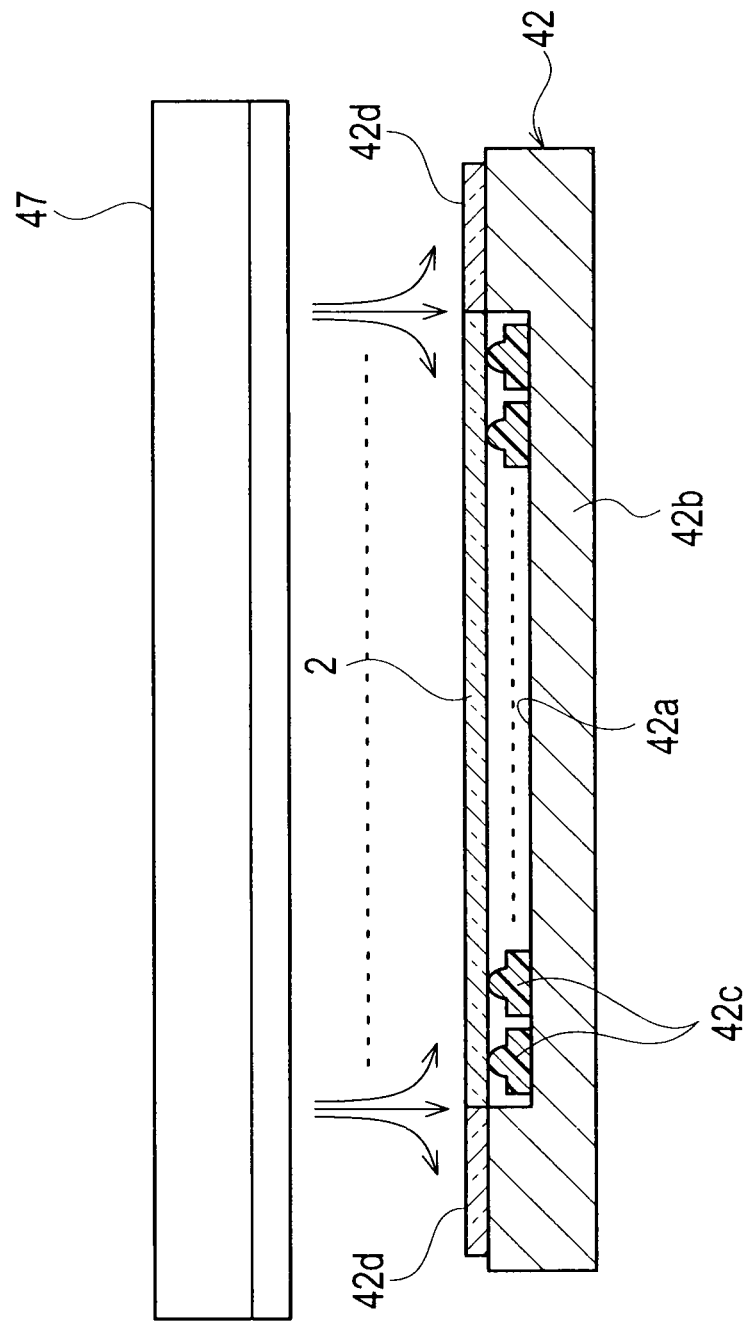
FIG. 18 is a sectional view taken along an A2-A2 line of FIG. 17.
Figure 19:
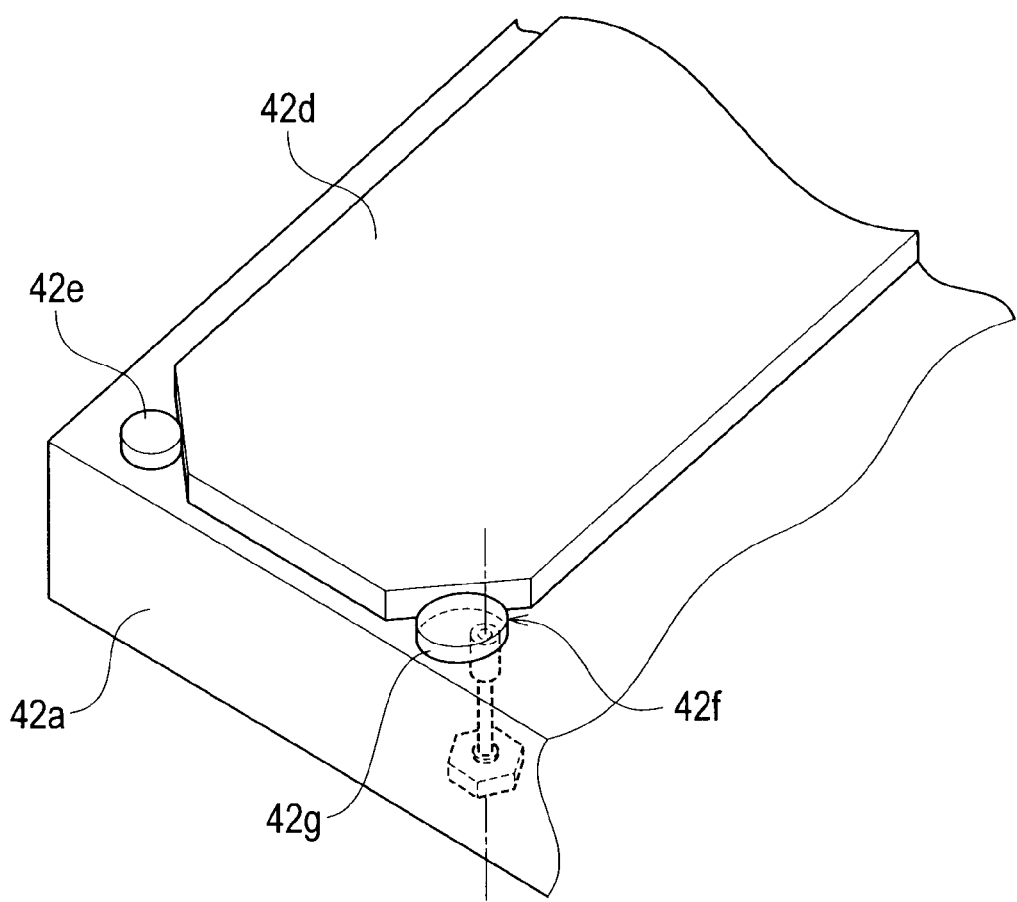
FIG. 19 is a perspective view showing a portion of the substrate holding table shown in FIG. 17 and FIG. 18.

As shown in FIG. 17 to FIG. 19, the substrate holding table 42 includes a base 42b having a depression portion 42a (see FIG. 18); a plurality of pin members 42c (see FIG. 18) which is provided on the bottom surface of the depression portion 42a, and which supports the substrate 2; a plurality of plate members 42d disposed in a frame shape on the base 42b but not on the depression portion 42a; and a plurality of positioning pins 42e and 42f which position those plate members 42d.

Each of the pin members 42c is a proxy pin, for example. These pin members 42c form a space between the substrate 2 and the base 42b. This avoids direct contact of the substrate 2 with the base 42b to suppress generation of a temperature difference between a contacting part and a non-contacting part of the substrate 2. Therefore, nonuniformity in the degree of unevenness of each solute object attributed to the temperature difference can be suppressed. Each plate member 42d is a glass substrate for a dummy, for example. Moreover, among the positioning pins 42e and 42f, three fixed pins 42e and one movable pin 42f exist for every plate member 42d. The movable pin 42f presses the substrate 2 against those fixed pins 42e to fix the substrate 2. A rotating plate 42g of this movable pin 42f (see FIG. 19) is formed rotatably, with the rotation axis of the rotating plate 42g being shifted from the center of the rotating plate 42g.

Each plate member 42d is provided around the substrate 2 on the substrate holding table 42, in other words, provided so as to surround a mounting region where the substrate 2 is placed. Thereby, a way how the gas hits or spreads becomes identical near the center of the substrate 2 and near an edge of the substrate 2, compared with a case where each plate member 42d does not exist. Accordingly, the sectional shape in the thickness direction of each solute object near the center of the substrate 2 and near the edge of the substrate 2 can be made identical. Here, when each plate member 42d does not exist, the way how the gas hits or spreads is different near the center of the substrate 2 and near the edge of the substrate 2. Accordingly, the sectional shape in the thickness direction of each solute object near the center of the substrate 2 and near the edge of the substrate 2 becomes different.

As described above, according to the sixth embodiment of the present invention, the same effects as those in the first embodiment can be obtained. Furthermore, by providing each plate member 42d around the substrate 2 on the substrate holding table 42, the way how the gas hits or spreads becomes identical near the center of the substrate 2 and near the edge of the substrate 2, compared with the case where each plate member 42d does not exist. Accordingly, the sectional shape in the thickness direction of each solute object near the center of the substrate 2 and near the edge of the substrate 2 can be made identical. Thereby, uniformity in the degree of unevenness of each solute object can be further improved within the surface of the object to be coated. As a result, generation of defective manufacturing of the coated article 2a attributed to variation in the sectional shape in the thickness direction of each solute object can be surely prevented.

(Seventh Embodiment)

A seventh embodiment of the present invention will be described with reference to FIG. 20 to FIG. 25.

The seventh embodiment of the present invention is a modification of the first embodiment, and a fluid blowing unit 101A according to the seventh embodiment of the present invention can be used for the dissolution-blowing head 43 or the dry-blowing head 47 according to the first embodiment. Therefore, description will be given on a part different from that in the first embodiment, i.e., the fluid blowing unit 101A. Note that, in the seventh embodiment, description of the same parts as those described in the first embodiment will be omitted.

Figure 20:
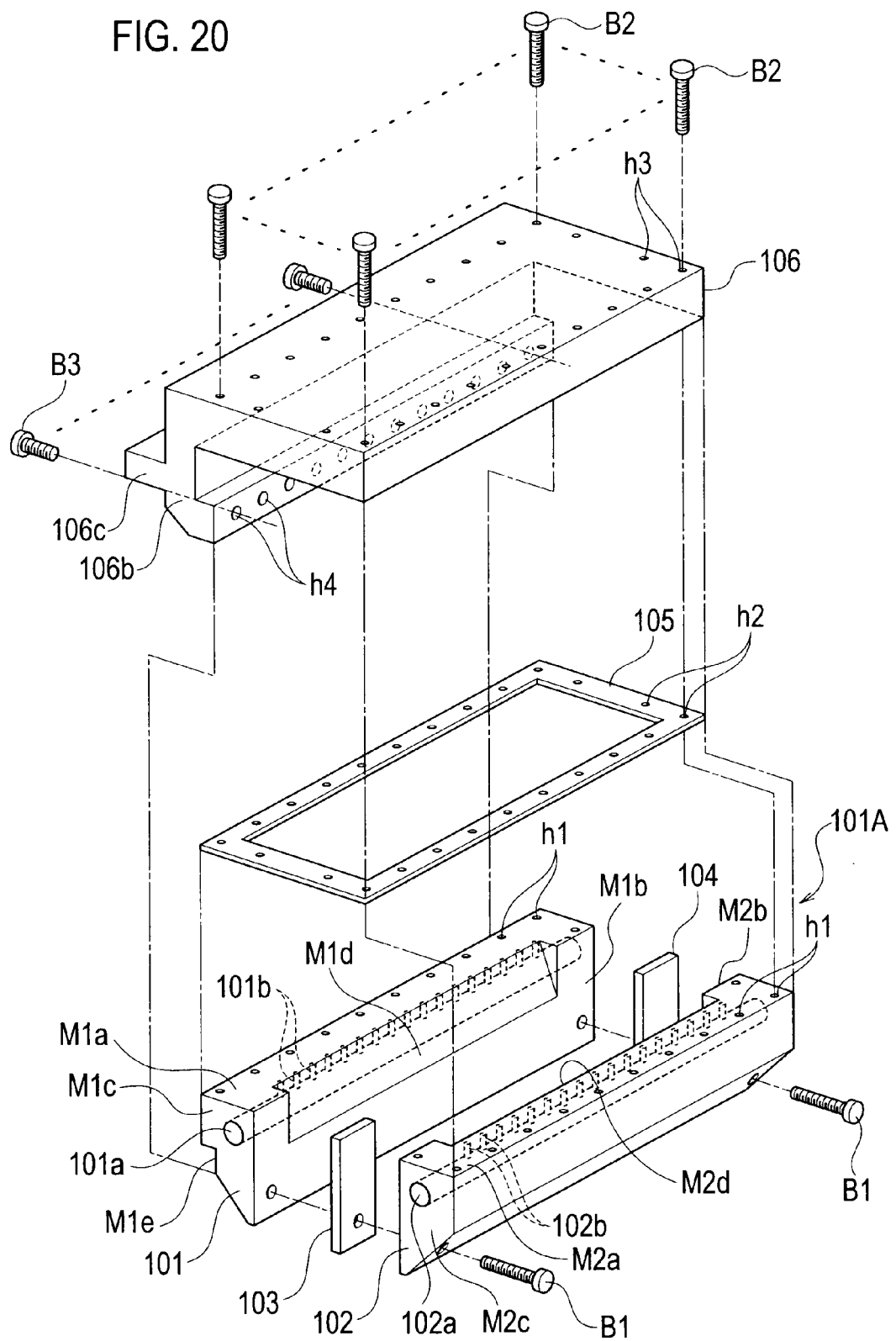
FIG. 20 is an exploded perspective view schematically showing a configuration of a fluid blowing unit according to a seventh embodiment of the present invention.
Figure 21:
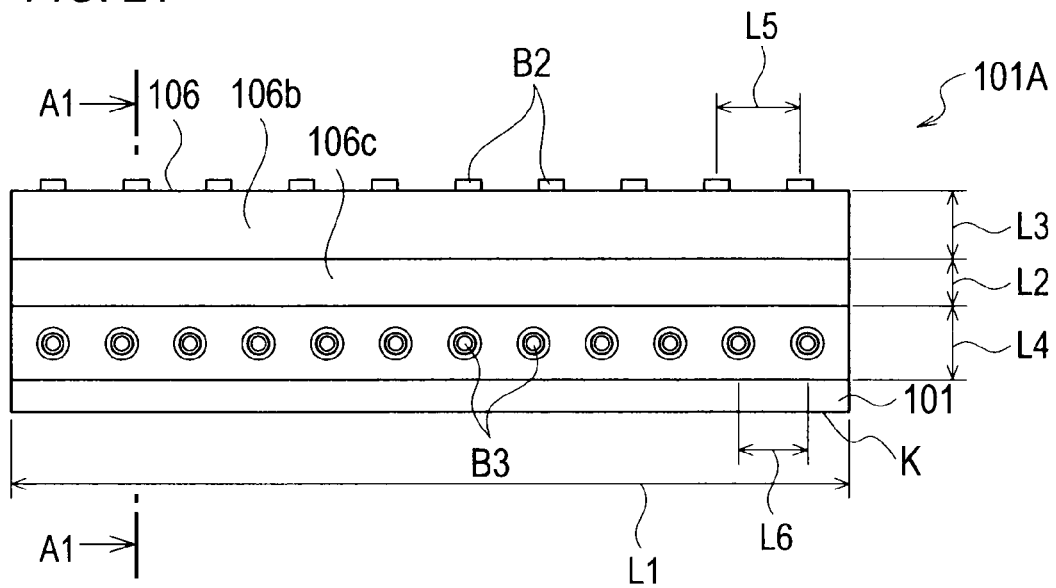
FIG. 21 is a front view showing the fluid blowing unit shown in FIG. 20.
Figure 22:
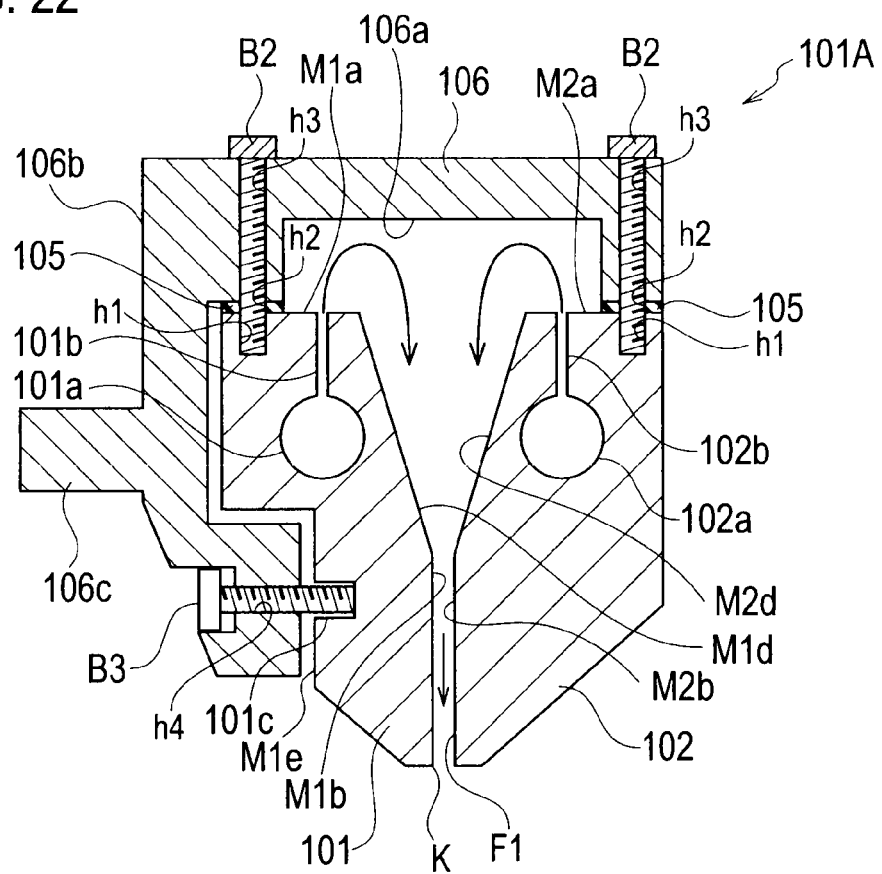
FIG. 22 is a sectional view taken along an A1-A1 line of FIG. 21.

As shown in FIG. 20 to FIG. 22, the fluid blowing unit 101A according to the seventh embodiment of the present invention includes: a pair of a first block member 101 and a second block member 102 which serve as a base; a pair of a first spacer member 103 and a second spacer member 104 provided therebetween; a frame-shape elastic member 105 having elasticity; and a lid member 106 provided on the base with the elastic member 105 interposed in between. In this fluid blowing unit 101A, a longitudinal direction (slit longitudinal direction) of a blowing port K is set in parallel to a direction perpendicular to the moving direction of the substrate 2 within a plane.

With the first spacer member 103 and the second spacer member 104 in between, the first block member 101 and the second block member 102 are fixed to each other by a plurality of fixing members B1 (see FIG. 20) such as a volt to form the base. The first spacer member 103 and the second spacer member 104 are provided to be located at the respective ends in the longitudinal direction of the first block member 101 and the second block member 102. Thereby, the blowing passage F1 (see FIG. 22) is formed into the shape of a long slit (elongated space) in a direction perpendicular to a direction in which a fluid (the dissolution gas or the drying gas) flows. The blowing port K of the fluid blowing unit 101A has a rectangular shape. The lid member 106 is fixed to the first block member 101 and the second block member 102 as the base by the plurality of fixing members B2 (see FIG. 20) such as a volt. Note that, for example, stainless steel and the like are used as a material of the first block member 101, the second block member 102, the first spacer member 103, and the second spacer member 104.

The first block member 101 is a member formed into a rectangular parallelepiped shape, and includes: a first block main surface M1a parallel to the longitudinal direction of the first block member 101; a first block longitudinal side surface M1b perpendicular to the first block main surface M1a and parallel to the longitudinal direction; a first block lateral side surface M1c perpendicular to the first block main surface M1b and parallel to the lateral direction of the first block member 101; a first block inclined surface M1d continuously inclined from the first block main surface M1a to the first block longitudinal side surface M1b; a first block passage 101a extending from the first block lateral side surface M1c in the longitudinal direction; and a plurality of first block narrow passages 101b which are narrower than the first block passage 101a, each of which extends from the first block main surface M1a in a direction perpendicular to the first block passage 101a, which are in communication with the first block passage 101a, and which are arranged side by side in the longitudinal direction.

The first block passage 101a is formed by forming a hole extending in the longitudinal direction in the first block lateral side surface M1c of the first block member 101. A supplying pipe (for example, the dissolution gas-supplying pipe 46 or the drying gas-supplying pipe 50) which supplies a fluid is connected to this first block passage 101a. Moreover, each first block narrow passage 101b is opened toward the bottom surface of a depression portion 106a of the lid member 106, and blows the fluid toward the bottom surface. These first block narrow passages 101b are formed by forming a plurality of holes (orifices) in the first block main surface M1a of the first block member 101, the holes extending in a direction perpendicular to the first block passage 101a.

The second block member 102 is a member formed into a rectangular parallelepiped shape, and includes: a second block main surface M2a parallel to the longitudinal direction of the second block member 102; a second block longitudinal side surface M2b perpendicular to the second block main surface M2a and parallel to the longitudinal direction; a second block lateral side surface M2c perpendicular to the second block main surface M2b and parallel to the lateral direction of the second block member 102; a second block inclined surface M2d continuously inclined from the second block main surface M2a to the second block longitudinal side surface M2b; a second block passage 102a extending from the second block lateral side surface M2c in the longitudinal direction; and a plurality of second block narrow passages 102b which are narrower than the second block passage 102a, each of which extends from the second block main surface M2a in a direction perpendicular to the second block passage 102a, which are in communication with the second block passage 102a, and which are arranged side by side in the longitudinal direction.

The second block passage 101b is formed by forming a hole extending in the longitudinal direction in the second block lateral side surface M2c of the second block member 102. A supplying pipe (for example, the dissolution gas-supplying pipe 46 or the drying gas-supplying pipe 50) which supplies a fluid is connected to this second block passage 102a. Moreover, each second block narrow passage 102b is opened toward the bottom surface of a depression portion 106a of the lid member 106, and blows the fluid toward the bottom surface. These second block narrow passages 102b are formed by forming a plurality of holes (orifices) in the second block main surface M2a of the second block member 102, the holes extending in a direction perpendicular to the second block passage 102a.

The first spacer member 103 is a plate-like member. The first spacer member 103 is located at one end in the longitudinal direction of the first block member 101 and the second block member 102 with the first block longitudinal side surface M1a facing the second block longitudinal side surface M2a. The first spacer member 103 is airtightly provided between the first block longitudinal side surface M1a and the second block longitudinal side surface M2a with a plate-thickness direction of the first spacer member 103 being perpendicular to the first block longitudinal side surface M1a and the second block longitudinal side surface M2a.

The second spacer member 104 is a plate-like member having the same thickness as the first spacer member 103 has. The second spacer member 104 is located at the other end opposite to the above-mentioned one end. The second spacer member 104 is airtightly provided between the first block longitudinal side surface M1a and the second block longitudinal side surface M2a with a plate-thickness direction of the second spacer member 104 being perpendicular to the first block longitudinal side surface M1a and the second block longitudinal side surface M2a.

The lid member 106 is a rectangular parallelepiped member, and has the depression portion 106a (see FIG. 22) extending in the longitudinal direction. The lid member 106 is provided on the first block main surface M1a and the second block main surface M2a with the elastic member 105 interposed in between while the first block member 101 and the second block member 102 are assembled with the first spacer member 103 and the second spacer member 104 interposed in between. Thereby, the depression portion 106a covers each of the first block narrow passages 101b of the first block main surface M1a and each of the second block narrow passages 102b of the second block main surface M2a.

Moreover, as shown in FIG. 20 and FIG. 22, a plurality of holes h1 into which the respective fixing members B2 are inserted are provided in the first block member 101 and the second block member 102. Further, a plurality of through holes h2 through which the respective fixing members B2 are inserted are provided in the elastic member 105. Furthermore, a plurality of through holes h3 through which the respective fixing members B2 are inserted are provided also in the lid member 106. The holes h1 are provided in a periphery of each of the block members 101 and 102 at equal pitches. The through holes h2 are provided along the shape of the elastic member 105 at equal pitches. The through holes h3 are provided in a periphery of the lid member 106 at equal pitches. A spiral groove is formed in each hole h1, and each hole h1 functions as a female screw. Therefore, as each fixing member B2, a male screw is used, for example.

Here, the diameter of the first block passage 101a and the second block passage 102a is 12 mm, for example. The diameter of the first block narrow passage 101b and the second block narrow passage 102b is 2 mm±0.005 mm, for example. The pitch of the first block narrow passage 101b and the second block narrow passage 102b is 10 mm, for example. Moreover, the slit distance (width in the lateral direction of the slit) of the blowing passage F1 is 0.5 mm or 1.5 mm, for example. In other words, the thickness of the pair of the first spacer member 103 and the second spacer member 104 is 0.5 mm or 1.5 mm, for example. Thus, it is possible to change the slit distance only by replacing the pair of the first spacer member 103 and the second spacer member 104 with a pair of spacer members having a different thickness. Therefore, the slit distance can be changed with easiness and more accuracy by preparing pairs of spacer members having various thicknesses.

With such a passage structure, the fluid (for example, the dissolution gas or the drying gas) flows into each of the first block narrow passages 101b and each of the second block narrow passages 102b from the first block passage 101a and the second block passage 102a. For that reason, the pressure loss of the fluid increases. Thereby, the blowing-air velocity from each of the first block narrow passages 101b and each of the second block narrow passages 102b becomes constant. Further, the fluid that has passed through each of the first block narrow passages 101b and each of the second block narrow passages 102b comes into contact with the bottom surface of the depression portion 106a of the lid member 106 and disperses. Subsequently, the fluid is guided by the first block inclined surface M1d and the second block inclined surface M2d and reaches the blowing passage F1. Accordingly, uniform flow rate distribution (blowing-air velocity distribution) not influenced by each of the first block narrow passages 101b and the second block narrow passages 102b can be obtained.

In addition to the depression portion 106a extending in the longitudinal direction, the lid member 106 includes: a reference portion 106b spaced along the first block opposed side surface M1e in the first block member 101, the first block opposed side surface M1e opposed to the first block longitudinal side surface M1b; and a plurality of pressing members B3 provided in the reference portion 106b and arranged side by side in the longitudinal direction so as to press the first block opposed side surface M1e.

Each pressing member B3 is a member for pressing the first block opposed side surface M1e, which is an outer surface (outer surface on the left side in FIG. 22) of the first block member 101, in a direction in which the blowing passage F1 becomes narrow. The reference portion 106b is spaced from the first block opposed side surface M1e of the first block member 101, and extends approximately in parallel to the longitudinal direction. This reference portion 106b is formed so as to have a larger flexural strength than that of the first block member 101, and the reference portion 106b serves as a reference position at the time of adjusting the slit distance.

A plurality of through holes h4 through which the pressing members B3 are respectively inserted are provided in the reference portion 106b. These through holes h4 are arranged in a direction perpendicular to a direction in which the fluid passes through the blowing passage F1, i.e., arranged in the longitudinal direction in a row. Moreover, a plurality of holes 101c are provided in the first block opposed side surface M1e of the first block member 101, the holes 101c facing the respective through holes h4. These holes 101c are also arranged in the longitudinal direction in a row. A spiral groove is formed in each through hole h4, and each through hole h4 functions as a female screw. Therefore, as each pressing member B3, a male screw is used, for example. The pressing member B3 is inserted into the through hole h4 and the hole 101c.

Moreover, the reference portion 106b is provided with a reinforcement portion 106c extending in the same direction (slit longitudinal direction) as the longitudinal direction of the reference portion 106a2. Thereby, warping of the reference portion 106b and the like are prevented. Here, since the fluid blowing unit 101A having the lid member 106 and the reference portion 106b is supported by a support member (for example, the supporter 44), desirably, the fluid blowing unit 101A has a light weight. For this reason, the reference portion 106b is formed to be as thin as possible. Therefore, the reference portion 106b serving as the reference position may warp in some cases. Thus, in order to prevent warping of the reference portion 106b, the reinforcement portion 106c for making the reference portion 106b thick is provided. This enables the strength of the reference portion 106b to be increased, while suppressing increase of the weight. Note that, when improvement in the strength is aimed rather than the weight, a plurality of reinforcement portions perpendicular to the reinforcement portion 106c may be provided at equal pitches, in addition to the reinforcement portion 106c.

Here, as shown in FIG. 21, a length L1 in the longitudinal direction of the fluid blowing unit 101A is, for example, 1000 mm, and is very long compared with a length in the lateral direction of the fluid blowing unit 101A (for example, approximately 70 mm). For this reason, warping is easily generated in the longitudinal direction of the fluid blowing unit 101A, and thus it is necessary to provide the reinforcement portion 106c. This reinforcement portion 106c is formed so as to have a thickness L2 of 5 mm, and is provided so as to have a length L3 of 30 mm and a length L4 of 30 mm. Note that a pitch L5 of the fixing members B2 is, for example, 40 mm while a pitch L6 of the pressing members B3 is, for example, 30 mm.

Note that the fluid blowing unit 101A is also enlarged along with enlargement of the substrate 2, and the size in the longitudinal direction of the blowing port K also increases, and is approximately 1000 mm, for example. For this reason, it is difficult to form the planar shape of the blowing port K into a rectangular shape, and particularly, the width (slit distance) in the lateral direction of the blowing port K is not uniform in many cases. In such a case, it is difficult to blow the dissolution gas uniformly (evenly), and accordingly uniformity in the degree of unevenness of each solute object is reduced within the surface of the substrate 2. For this reason, it is necessary to adjust the width (slit distance) in the lateral direction of the blowing port K to be uniform.

When the slit distance is adjusted, each pressing member B3 is rotated by an operator or the like to adjust a pressing force that presses the outer surface (the first block opposed side surface M1e) of the first block member 101 of the fluid blowing unit 101A and to change the slit distance of the blowing passage F1. At this time, the pressing force is adjusted so that the planar shape of the slit-shape blowing port K may be rectangular, in other words, the passage sectional shape of the blowing passage F1 of the fluid blowing unit 101A may be rectangular. This allows fine adjustment of the blowing-air velocity distribution. Note that, when this pressing force is weakened, the slit distance of the blowing passage F1 is widened by the restoring force of the first block member 101.

Here, when the blowing-air velocity distribution is generated, variation in the sectional shape in the thickness direction of each solute object is generated within the surface of the object to be coated. Moreover, when the blowing-air velocity distribution is not uniform, air velocity conditions have to be set in accordance with a portion where an air velocity is weak, the gas is consumed more than needed. For that reason, the running cost deteriorates. Therefore, it is necessary to adjust the blowing-air velocity distribution to be uniform.

When the blowing-air velocity distribution is adjusted, an adjustment person such as an operator uses, for example, a hot wire anemometer (not shown) which measures an air velocity based on temperature change of a hot wire. Specifically, the hot wire is brought close to the vicinity of the blowing port K of the fluid blowing unit 101A to measure the air velocity at each spot as the hot wire is moved in the longitudinal direction of the blowing port K at equal pitches. In detail, first, the adjustment person moves the hot wire at a pitch of 30 mm in the slit longitudinal direction under the pressing members B3 from the pressing member B3 at the left end (in FIG. 21), and sequentially measures the air velocity under the pressing members B3. Next, the adjustment person moves the hot wire at a pitch of 30 mm in the slit longitudinal direction under the pressing members B3 from a center between the pressing members B3 (a position at 15 mm from the pressing member B3 at the left end), and sequentially measures the air velocity under the centers between the pressing members B3. Then, the adjustment person finely adjusts each pressing member B3 on the basis of the measured air velocity to make the blowing-air velocity distribution uniform. Note that the air velocity of the dissolution gas is adjusted in accordance with the kind of the ink to be used, etc. For example, the air velocity of the dissolution gas is 1.5 m/s±0.05 m/s. Similarly, the air velocity of the drying gas is also adjusted in accordance with the kind of the ink to be used, etc. For example, the air velocity of the drying gas is 3.0 m/s±0.05 m/s.

Moreover, in order to reduce adjustment burden of the blowing-air velocity distribution, i.e., adjustment burden of the slit distance, preferably, the slit distance (width in the lateral direction of the blowing port K) is set constant in advance. In order to make the slit distance constant, preferably, the first spacer member 103 and the second spacer member 104 have the same flatness. Further, in order to make the wall surface, which forms the blowing passage F1, parallel, preferably, the front and back surfaces of the first spacer member 103 and those of the second spacer member 104 are parallel. Accordingly, a polishing process for simultaneously polishing the first spacer member 103 and the second spacer member 104 is performed.

Figure 23:
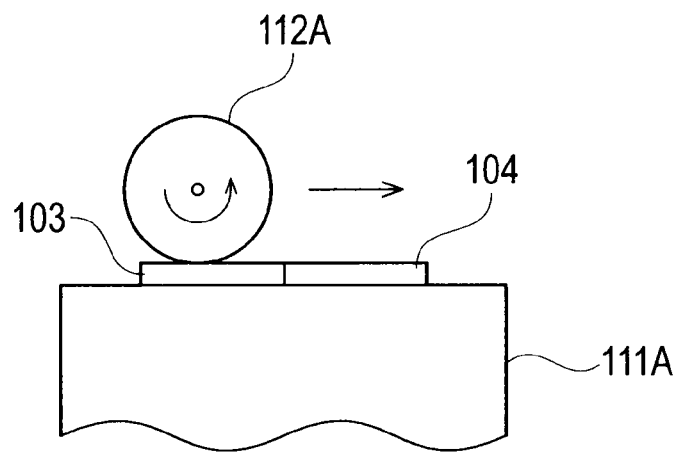
FIG. 23 is a first process side view showing a polishing process for polishing a pair of spacer members that the fluid blowing unit shown in FIG. 20 to FIG. 22 includes.
Figure 24:
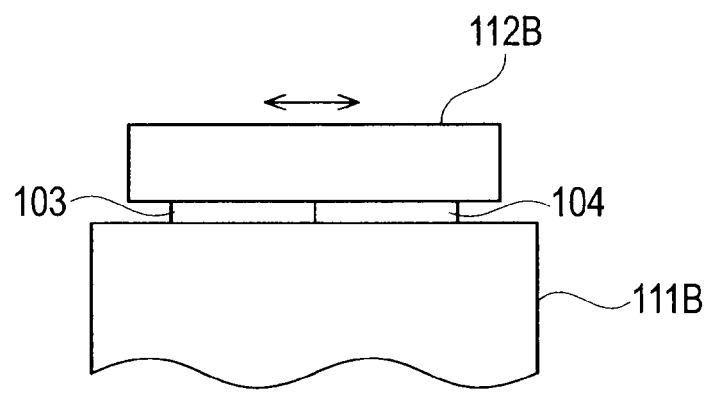
FIG. 24 is a second process side view.
Figure 25:
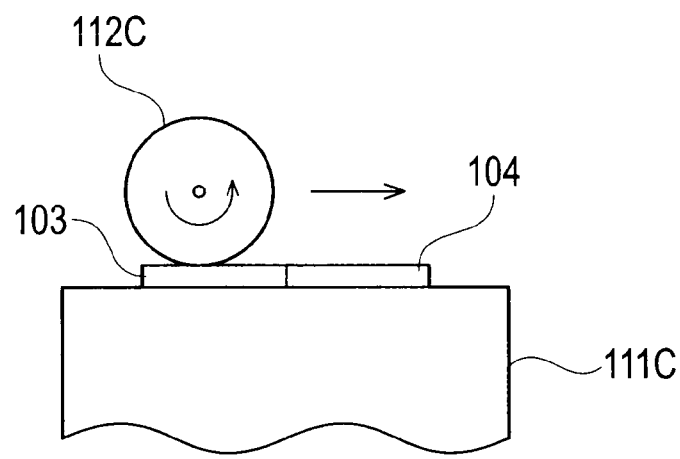
FIG. 25 is a third process side view.

In other words, in the polishing process of the pair of the first spacer member 103 and the second spacer member 104, as shown in FIG. 23, the pair of the first spacer member 103 and the second spacer member 104 are placed on a mounting base 111A, and are polished with a polishing member 112A for rough cutting in that state (first polishing). Next, as shown in FIG. 24, the pair of the first spacer member 103 and the second spacer member 104 after the first polishing are placed on a mounting base 111B, and are polished with a polishing member 112B, such as a lapping machine with a grinding stone, in that state (second polishing). Finally, as shown in FIG. 25, the pair of the first spacer member 103 and the second spacer member 104 after the second polishing are placed on a mounting base 111C, and are polished with a polishing member 112C for buffing in that state (third polishing).

Thus, the first spacer member 103 and the second spacer member 104 can be simultaneously polished by using the pair of the first spacer member 103 and the second spacer member 104 in order to form the slit-shape blowing passage F1. Accordingly, the flatness of the pair of the first spacer member 103 and the second spacer member 104 can be made identical, and the degree of parallelization between the front and back surfaces of the first spacer member 103 and those of the second spacer member 104 can be further improved. Particularly, the pair of the first spacer member 103 and the second spacer member 104 are very small plate members compared with the pair of the first block member 101 and the second block member 102. For that reason, multiple times of the polishing process can be simultaneously performed on the first spacer member 103 and the second spacer member 104, and thus, a desired surface precision (for example, flatness of 0.02 mm or less) can be obtained.

Therefore, since the first spacer member 103 and the second spacer member 104 are formed as separated bodies from the first block member 101 and the second block member 102 to form the fluid blowing unit 101A, a desired surface precision can be obtained easily compared with a case where those members are one piece. When some or all of the spacer members are integrally formed, slice machining or the like is used. For that reason, the surface precision deteriorates, for example, the flatness is approximately 0.1 mm, and it is difficult to obtain a desired surface precision (for example, flatness of 0.02 mm or less).

As described above, according to the seventh embodiment of the present invention, the same effects as those in the first embodiment can be obtained. Furthermore, by providing the first block passage 101a, the second block passage 102a, the first block narrow passages 101b, and the second block narrow passages 102b, the fluid (for example, the dissolution gas or the drying gas) flows into the first block narrow passages 101b and the second block narrow passages 102b from the first block passage 101a and the second block passage 102a. Thereby, the pressure loss of the fluid increases, and the blowing-air velocity from the first block narrow passages 101b and the second block narrow passages 102b becomes constant. Additionally, since the first block narrow passages 101b and the second block narrow passages 102b blow the fluid toward the bottom surface of the depression portion 106a of the lid member 106, the fluid, which has passed through the first block narrow passages 101b and the second block narrow passages 102b, comes into contact with the bottom surface of the depression portion 106a, disperses, and subsequently reaches the blowing passage F1. Thus, uniform blowing-air velocity distribution (flow rate distribution) can be obtained, without being influenced by the first block narrow passages 101b and the second block narrow passages 102b. In this manner, uniformity in the degree of unevenness of each solute object can be further improved within the surface of the object to be coated. As a result, generation of defective manufacturing of the coated article 2a attributed to variation in the sectional shape in the thickness direction of each solute object can be surely prevented.

Moreover, the slit distance of the blowing passage F1 of the fluid blowing unit 101A can be adjusted by providing the reference portion 106b to the lid member 106 and providing and arranging each pressing member B3 in the reference portion 106b side by side in the longitudinal direction. Accordingly, uniform blowing of the fluid (for example, the dissolution gas or the drying gas) from the fluid blowing unit 101A, i.e., uniform blowing-air velocity distribution can be achieved more surely. Furthermore, since no pressing member B3 exists within the blowing passage F1, a flow of the fluid that passes through the blowing passage F1 is not obstructed compared with a case where pressing members exist within the blowing passage F1. Accordingly, the fluid can be blown uniformly. Therefore, since the whole surface of the substrate 2 is moisturized uniformly when the fluid is the dissolution gas, uniformity in the degree of unevenness of each solute object can be improved within the surface of the substrate 2.

Note that, in the present embodiment of the invention, the fluid blowing unit 101A is used for a gas blowing unit, such as the dissolution-blowing head 43 or the dry-blowing head 47, but the application is not limited to this. The present embodiment can also be used for a liquid blowing unit which blows a liquid as a fluid, for example.

(Other Embodiments)

Note that, the present invention will not be limited to the above-mentioned embodiments, and various modifications are possible without deviating from the scope of the present invention.

For example, in the above-mentioned embodiments, the substrate 2 is moved relative to the dissolution-blowing head 43 of the dissolution-blower 6b, the dry-blowing head 47 of the dry-blower 6c, and the suction head 51 of the exhaust part 6d, but the present invention is not limited to this. For example, the dissolution-blowing head 43, the dry-blowing head 47, and the suction head 51 may be moved relative to the substrate 2; and the dissolution-blowing head 43, the dry-blowing head 47, and the suction head 51 as well as the substrate 2 may be moved relatively.

Moreover, in the above-mentioned embodiments, the dissolution-blowing head 43 of the dissolution-blower 6b, the dry-blowing head 47 of the dry-blower 6c, and the suction head 51 of the exhaust part 6d are provided so that each relative position to the substrate 2 is changeable, but the present invention is not limited to this. For example, the above-mentioned components may be provided in a way that each relative position to the substrate 2 is fixed.

Moreover, in the above-mentioned embodiments, the dissolution-blowing head 43 and the suction head 51 are provided as separate bodies, but the present invention is not limited to this. For example, the dissolution-blowing head 43 and the suction head 51 may be connected to each other so as to have an integrated structure.

Moreover, in the above-mentioned embodiments, the exhaust part 6d (the suction head 51, the exhaust pipe 54, etc.) is provided, but the present invention is not limited to this. When local and gradual increase of humidity within the unit is avoided by properly maintaining the volume of moisturization or forcibly replacing an atmosphere within the unit for every process, it is not necessary to provide the exhaust part 6d (the suction head 51, the exhaust pipe 54, etc.).

Moreover, in the above-mentioned embodiments, the second solvent is vaporized and blown, but the present invention is not limited to this. When it is designed to sufficiently prevent scattering of the solvent, an atomized solvent may be blown to the solute with a dried gas.

Moreover, in the above-mentioned embodiments, illustrated are the processes in which: the first solution is ejected and adhered to the object to be coated; subsequently the reduced pressure drying process is performed; and then the solute is dissolved with the second solvent. But the present invention is not limited to this. When the reduced pressure drying is not necessary for manufacturing products, this step may be skipped.

Additionally, the first solvent and the second solvent may be liquids having the same composition, or may be liquids having different compositions. Note that, usually, a solvent showing satisfactory separativeness as a liquid from the droplet jet head F is preferably used as the first solvent, and water is preferably used as the second solvent from the viewpoint of work environment preservation. As the solvent, as long as there is no special reason, a substance that does not form any reaction product by chemically reacting with the solute is selected. However, the solvent may be selected appropriately as necessary.

Moreover, in the above-mentioned embodiments, the substrate 2 passing under each distance sensor 71 of the detector 6f is reciprocally moved, and the spacing distance H4 is sequentially measured on an outward trip, while dissolution and drying are performed on the basis of the measurement data on a return trip. But the present invention is not limited to this. For example, all of the measurement, dissolution, and drying may be performed on the outward trip. In this case, the spacing distance H4 is sequentially measured on the outward trip, and the dissolution and drying are sequentially performed in real time on the basis of the measurement data.

Moreover, in the above-mentioned embodiments, the dissolution-blowing head 43 and the dry-blowing head 47 are horizontally moved in the Z axis direction with the supporter 44 and the supporter 48, but the present invention is not limited to this. The dissolution-blowing head 43 and the dry-blowing head 47 may be inclined and moved in the Z axis direction. In this case, two pieces of measurement data measured by the two distance sensors 71 located on both sides can be used as they are without averaging. Thereby, the spacing distance H1 and the spacing distance H2 to the moving substrate 2 can be made constant with precision, and thus moisturization and drying can be performed more uniformly all over the substrate 2.

Moreover, in the above-mentioned embodiments, the substrate accommodating part 3, the droplet jet module 4, the reduced pressure-drying module 5, the remoisturizing-drying module 6, the coated article-accommodating part 7, and the conveyor 8 are modularized and formed as one system. But the present invention is not limited to this. For example, the substrate accommodating part 3, the droplet jet module 4, the reduced pressure-drying module 5, the remoisturizing-drying module 6, the coated article-accommodating part 7, and the conveyor 8 may be integrally formed as one unit. Furthermore, some of them, for example, only the droplet jet module 4, the reduced pressure-drying module 5, and the remoisturizing-drying module 6 may be integrally formed as one unit.

Finally, in the above-mentioned embodiments, various values have been mentioned, but those values are exemplification and are not interpreted as limitation.

Industrial Applicability

Hereinabove, although the embodiments of the present invention have been described, the embodiments only illustrate specific examples of the present invention and do not particularly limit the present invention. A specific configuration or the like of each part can be modified where relevant. The described effects and advantages of each embodiment only enumerate the most suitable effects and advantages resulted from the present invention, and the effects and advantages of the present invention are not limited to what have been described in each embodiment of the present invention. For example, the present invention is used in an apparatus that ejects droplets toward an object to be coated, a method for manufacturing a coated article to which a solute of these droplets adheres, a unit that blows a fluid, etc.

What is claimed is:

1. A coater comprising:
   a droplet jet part which ejects a plurality of droplets of a solution containing a polymer material functions as a pinning agent toward an object to be coated to apply the droplets to a surface of the object, each of the droplets applied on the surface having a fixed diameter;
   a reduced pressure-dryer which performs reduced pressure drying on the droplet applied on the surface to form a plurality of residues of the droplets on the surface, each of the residues remaining the fixed diameter; and a remoisturizing-drying part which blows a dissolution gas toward the residues to form a plurality of applied bodies containing the residues as a solute, each of the applied bodies remaining the fixed diameter, the dissolution gas containing a solvent dissolving the residues, and which blows a drying gas toward the applied bodies formed on the surface to dry the applied bodies thereby forming a plurality of solute objects on the surface, each of the solute objects remaining the fixed diameter with a substantially identical thickness, a sectional shape in a thickness direction of each of the solute objects having a trapezoidal shape whose upper end portion is flat with the thickness on an entire of the surface.

2. The coater according to claim 1, further comprising:

a conveyor which conveys the object to be coated among the droplet jet part, the reduced pressure-dryer, and the remoisturizing-drying part.

3. The coater according to claim 1, wherein the remoisturizing-drying part is formed so that a flow rate distribution of the dissolution gas in a direction perpendicular to a moving direction of the object to be coated within a level surface is changeable.

4. The coater according to claim 1, wherein the remoisturizing-drying part is formed so that a flow rate distribution of the drying gas in a direction perpendicular to a moving direction of the object to be coated within a level surface is changeable.

5. The coater according to claim 1, wherein the remoisturizing-drying part comprises:

a dissolution-blower which blows the dissolution gas toward the residues formed on the surface ; and a dry-blower which blows the drying gas toward the applied bodies formed on the surface ; and the dissolution-blower comprises:

a dissolution blowing head which blows the dissolution gas;

a dissolution gas-supplier which supplies the dissolution gas to the dissolution blowing head; and a dissolution gas-supplying pipe which connects the dissolution blowing head to the dissolution gas-supplier, and through which the dissolution gas passes; and the dry-blower comprises:

a dry-blowing head which blows the drying gas;

a drying gas-supplier which supplies the drying gas to the dry-blowing head; and a drying gas-supplying pipe which connects the dry-blowing head to the drying gas-supplier, and through which the drying gas passes.

6. The coater according to claim 5, wherein the dissolution gas-supplying pipe has a heater on an outer circumference thereof.

7. The coater according to claim 1, wherein the remoisturizing-drying part comprises an exhaust part which inhales the dissolution gas blown by the dissolution-blower and exhausts the dissolution gas to an outside.

8. The coater according to claim 7, wherein the exhaust part comprises:

a suction head which sucks the dissolution gas blown by the dissolution-blower;

a suction part which supplies a suction force to the suction head; and an exhaust pipe which connects the suction head to the suction part, and through which the sucked dissolution gas passes.

9. The coater according to claim 5, further comprising:

a moving mechanism which relatively moves the object to be coated, the dissolution blowing head and the dry-blowing head in a direction parallel with the surface of the object to be coated;

a detector for detecting a first spacing distance which corresponds to a thickness of the object to be coated;

a first head moving mechanism for moving the dissolution blowing head in a direction perpendicular with the surface of the object to be coated;

a second head moving mechanism for moving the dry-blowing head in the direction perpendicular with the surface of the object to be coated; and a controller which, on the basis of the detected first spacing distance, controls the first head moving mechanism so that a spacing distance between the surface of the relatively moving object to be coated and the dissolution blowing head may be constant, and controls the second head moving mechanism so that a spacing distance between the surface of the relatively moving object to be coated and the dry-blowing head may be constant.

10. The coater according to claim 9, wherein the dissolution-blower comprises:

an exhaust pipe which exhausts the dissolution gas from the dissolution gas-supplier;

a first path communicated the dissolution gas-supplier with the dissolution gas-supplying pipe;

a second path communicated the dissolution gas-supplier with the exhaust pipe; and a path switching part which switches between the first path and the second path.

11. The coater according to claim 9, wherein the dissolution-blower comprises:

a gas receiver which receives the dissolution gas blown by the dissolution blowing head; and a receiver moving mechanism which moves the gas receiver in a blowing direction of the dissolution gas so that the gas receiver can be approached to and spaced from the dissolution blowing head.

12. The coater according to claim 5, wherein the dissolution blowing head comprises:

a head base having an inner surface which forms a slit-shape blowing passage and an outer surface opposing to the inner surface;

a base member which is a member provided to the head base, and which has a reference portion spaced along the outer surface; and a plurality of pressing members provided in the reference portion and arranged side by side in a slit longitudinal direction so as to be capable of pressing the outer surface.

13. The coater according to claim 5, wherein the dry-blowing head comprises:

a head base having an inner surface which forms a slit-shape blowing passage and an outer surface opposing to the inner surface;

a base member which is a member provided to the head base, and which has a reference portion spaced along the outer surface; and a plurality of pressing members provided in the reference portion and arranged side by side in a slit longitudinal direction so as to be capable of pressing the outer surface.

14. The coater according to claim 7, wherein the exhaust part comprises:

a suction head which is a rectangular parallelepiped box-shape head, and which has a rectangular intake port that sucks the dissolution gas blown by the dissolution blowing head of the dissolution-blower;

a plurality of buffers each of which is provided in parallel to a longitudinal direction of the intake port, and which are arranged side by side in a direction perpendicular to both the longitudinal direction and a lateral direction of the intake port;

a plurality of pipes arranged side by side in the longitudinal direction of the intake port, connecting the suction head to the buffer adjacent thereto, and connecting the buffers adjacent to each other; and an exhaust pipe connected to the buffer located farthest from the suction head, and the plurality of pipes are disposed so that a plurality of exhaust routes extending from the suction head to the exhaust pipe may have a same length, and that the number of the pipes connected may be reduced from the suction head toward the exhaust pipe every time those exhaust routes pass through the buffers.

15. The coater according to claim 1, wherein
the remoisturizing-drying part comprises a substrate holding table on which the object to be coated is mounted, and
the substrate holding table comprises a plurality of plate members provided so as to surround a mounting region on which the object to be coated is mounted.

16. A method for manufacturing a coated article, comprising:
ejecting a plurality of droplets of a solution containing a polymer material functions as a pinning agent toward an object to be coated to apply the droplets to a surface of the object each of the droplets applied on the surface having a fixed diameter;

performing reduced pressure drying on the droplet applied on the surface to form a plurality of residues of the droplets on the surface, each of the residues remaining the fixed diameter;

blowing a dissolution gas toward the residues to form applied bodies with a solution containing the residue as a solute, each of the applied bodies remaining the fixed diameter, the dissolution gas containing a solvent dissolving the residue; and blowing a drying gas toward the applied bodies formed on the surface to dry the applied bodies thereby forming solute objects on the surface, each of the solute objects remaining the fixed diameter with a substantially identical thickness, a sectional shape in a thickness direction of each of the solute objects having a trapezoidal shape whose upper end portion is flat with the thickness on an entire of the surface.

17. The method for manufacturing a coated article according to claim 16, wherein
the blowing a dissolution gas includes inhaling the blown dissolution gas and exhausting inhaled dissolution gas.

18. The method for manufacturing a coated article according to claim 16, wherein
the blowing the dry gas includes inhaling the blown dry gas and exhausting inhaled dry gas.

19. The coater according to claim 1, wherein the solution further contains a water-absorbing low-vapor-pressure solvent.

20. The method for manufacturing a coated article according to claim 16, wherein the solution further contains a water-absorbing low-vapor-pressure solvent.

* * * * *

UNITED STATES PATENT AND TRADEMARK OFFICE
CERTIFICATE OF CORRECTION

PATENT NO. : 8,490,571 B2  
APPLICATION NO. : 12/528866  
DATED : July 23, 2013  
INVENTOR(S) : Sato et al.

Page 1 of 1

It is certified that error appears in the above-identified patent and that said Letters Patent is hereby corrected as shown below:

In the specification, column 11, line 6, please add -- 47 -- after "head"

In the specification, column 25, line 14, please add -- 45 -- after "gas-supplier"

Signed and Sealed this  
First Day of October, 2013

Teresa Stanek Rea  
*Deputy Director of the United States Patent and Trademark Office*